US011176296B1

(12) United States Patent
Jha et al.

(10) Patent No.: US 11,176,296 B1
(45) Date of Patent: Nov. 16, 2021

(54) UNIFIED DATA MODEL FOR HETEROGENEOUS INTEGRATED CIRCUIT

(71) Applicant: Xilinx, Inc., San Jose, CA (US)

(72) Inventors: Pradip Jha, Cupertino, CA (US); Brendan Matthew O'Higgins, Sunnyvale, CA (US); Dinesh K. Monga, Santa Clara, CA (US); Bart Reynolds, Manzanita, OR (US); Ryan Linderman, Longmont, CO (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 17/007,177

(22) Filed: Aug. 31, 2020

(51) Int. Cl.
*G06F 30/30* (2020.01)
*G06F 30/327* (2020.01)
(Continued)

(52) U.S. Cl.
CPC ............ *G06F 30/327* (2020.01); *G06F 9/451* (2018.02); *G06F 15/7825* (2013.01); *G06F 30/33* (2020.01); *G06F 30/39* (2020.01)

(58) Field of Classification Search
CPC .. G06F 30/327; G06F 15/7867; G06F 30/392; G06F 15/7871; G06F 30/34; G06F 9/3897; G06F 9/50; G06F 11/1423; G06F 11/1428; G06F 30/3312; G06F 30/394; G06F 13/16; G06F 13/4068; G06F 13/4265; G06F 13/28; G06F 16/22; G06F 30/33; G06F 30/331; G06F 30/3323; G06F 30/398; G06F 11/3648; G06F 11/3656; G06F 12/0646; G06F 21/51; G06F 2221/2143; G06F 3/0607; G06F 3/0629; G06F 3/0635; G06F 3/0644; G06F 3/0685; G06F 9/5044; G06F 2117/08; G06F 30/30; G06F 30/337; G06F 13/4022; G06F 13/404; G06F 15/8007; G06F 2111/04; G06F 2111/20; G06F 2115/10; G06F 2119/12; G06F 30/343; G06F 30/347; G06F 30/367; G06F 30/396; G06F 8/20; G06F 8/35; G06F 8/443; G06F 8/447; G06F 9/5066; H03K 19/17736; H03K 19/17756; H03K 19/17748; H03K 19/17796; H03K 19/17728; H03K 19/1774; H01L 27/0207;
(Continued)

(56) References Cited

U.S. PATENT DOCUMENTS 6,195,788 B1 * 2/2001 Leaver .................... G06F 30/34
716/116
8,156,456 B1 4/2012 Rahman et al.
(Continued)

*Primary Examiner* — Binh C Tat
(74) *Attorney, Agent, or Firm* — Kevin T. Cuenot

(57) ABSTRACT

A unified data model for creating a circuit design for a heterogeneous integrated circuit is provided. The unified data model is stored as a data structure in computer hardware. The unified data model includes a unified netlist specifying the circuit design and a unified device model representing the heterogeneous integrated circuit. The unified netlist includes netlist objects configured to communicate over bitwise connections and network connections representing packet-based communications. The unified netlist may be mapped to the unified device model using computer hardware. Using the computer hardware, at least a portion of the device model may be displayed in coordination with at least a portion of the unified netlist mapped thereto.

20 Claims, 11 Drawing Sheets

(51) Int. Cl.
*G06F 30/33* (2020.01)
*G06F 9/451* (2018.01)
*G06F 15/78* (2006.01)
*G06F 30/39* (2020.01)

(58) Field of Classification Search
CPC ......... H01L 27/11807; H01L 21/76886; H01L 23/528
USPC .................................................. 716/100–109
See application file for complete search history.

(56) References Cited

U.S. PATENT DOCUMENTS

| | | | |
|---|---|---|---|
| 10,331,830 B1* | 6/2019 | Teiche | ................ G06F 15/8007 |
| 2004/0194048 A1* | 9/2004 | Arnold | .................. G06F 30/392 |
| | | | 716/116 |

* cited by examiner

UNIFIED DATA MODEL FOR HETEROGENEOUS INTEGRATED CIRCUIT

RESERVATION OF RIGHTS IN COPYRIGHTED MATERIAL

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

TECHNICAL FIELD

This disclosure relates to a unified data model for use by a design application for a heterogeneous integrated circuit.

BACKGROUND

Some integrated circuits (ICs), referred to as heterogeneous ICs, include a plurality of different systems. Whether formed of a single die or a plurality of interconnected dies, a heterogeneous IC may be provided as a single package. The different systems may differ from one another in terms of architecture and may be designed for different purposes. For example, one system on such an IC may be programmable logic while another system on the IC may be a processor array. The IC may also include other disparate types of systems.

The usual process of creating a circuit design for implementation within a heterogeneous IC is a computer-based process that entails using multiple different design applications. Each system of the IC has a corresponding design application specifically tailored for that system. The different design applications account for the different architectures and characteristic properties and/or peculiarities of each respective system. For example, a user would use a first design application to create portions of the circuit design to be implemented in the programmable logic and a second, different design application to create portions of the circuit design to be implemented in the processor array.

Each of these different design applications uses its own software infrastructure suited for the corresponding system of the heterogeneous IC. The infrastructures are not common among the different design applications. The disparate software infrastructure can hinder development of the circuit design. For example, use of disparate, system-specific design applications can result in a piecemeal development approach where users create the circuit design without the benefit of a unified and comprehensive representation or view of the circuit design as a whole in relation to the heterogeneous IC. This piecemeal approach also hinders cross-system optimization of the circuit design as may be performed by the various design applications.

SUMMARY

In one aspect, a method can include providing a unified data model for creating a circuit design for a heterogeneous integrated circuit. The unified data model is stored as a data structure in computer hardware. The unified data model includes a unified netlist specifying the circuit design and a unified device model representing the heterogeneous integrated circuit. The unified netlist includes netlist objects configured to communicate over bitwise connections and network connections representing packet-based communications. The method can include mapping, using the computer hardware, the unified netlist to the unified device model and displaying, using the computer hardware, at least a portion of the device model in coordination with at least a portion of the unified netlist mapped thereto.

In another aspect, a system can include a memory configured to store a unified data model for a circuit design for a heterogeneous integrated circuit therein as a data structure. The unified data model includes a unified netlist specifying the circuit design and a unified device model representing the heterogeneous integrated circuit. The unified netlist includes netlist objects configured to communicate over bitwise connections and network connections representing packet-based communications. The system can include a processor configured to initiate executable operations. The executable operations can include mapping the unified netlist to the unified device model and displaying at least a portion of the device model in coordination with at least a portion of the unified netlist mapped thereto.

In another aspect, a computer program product includes one or more computer readable storage media storing a unified data model for a circuit design for a heterogeneous integrated circuit therein as a data structure. The unified data model can include a unified netlist specifying the circuit design and a unified device model representing the heterogeneous integrated circuit. The unified netlist includes netlist objects configured to communicate over bitwise connections and network connections representing packet-based communications. The one or more computer readable storage media can store program instructions executable by computer hardware to initiate operations. The operations can include mapping the unified netlist to the unified device model and displaying at least a portion of the device model in coordination with at least a portion of the unified netlist mapped thereto.

This Summary section is provided merely to introduce certain concepts and not to identify any key or essential features of the claimed subject matter. Other features of the inventive arrangements will be apparent from the accompanying drawings and from the following detailed description.

BRIEF DESCRIPTION OF THE DRAWINGS

The inventive arrangements are illustrated by way of example in the accompanying drawings. The drawings, however, should not be construed to be limiting of the inventive arrangements to only the particular implementations shown. Various aspects and advantages will become apparent upon review of the following detailed description and upon reference to the drawings.

DETAILED DESCRIPTION

Figure 1:
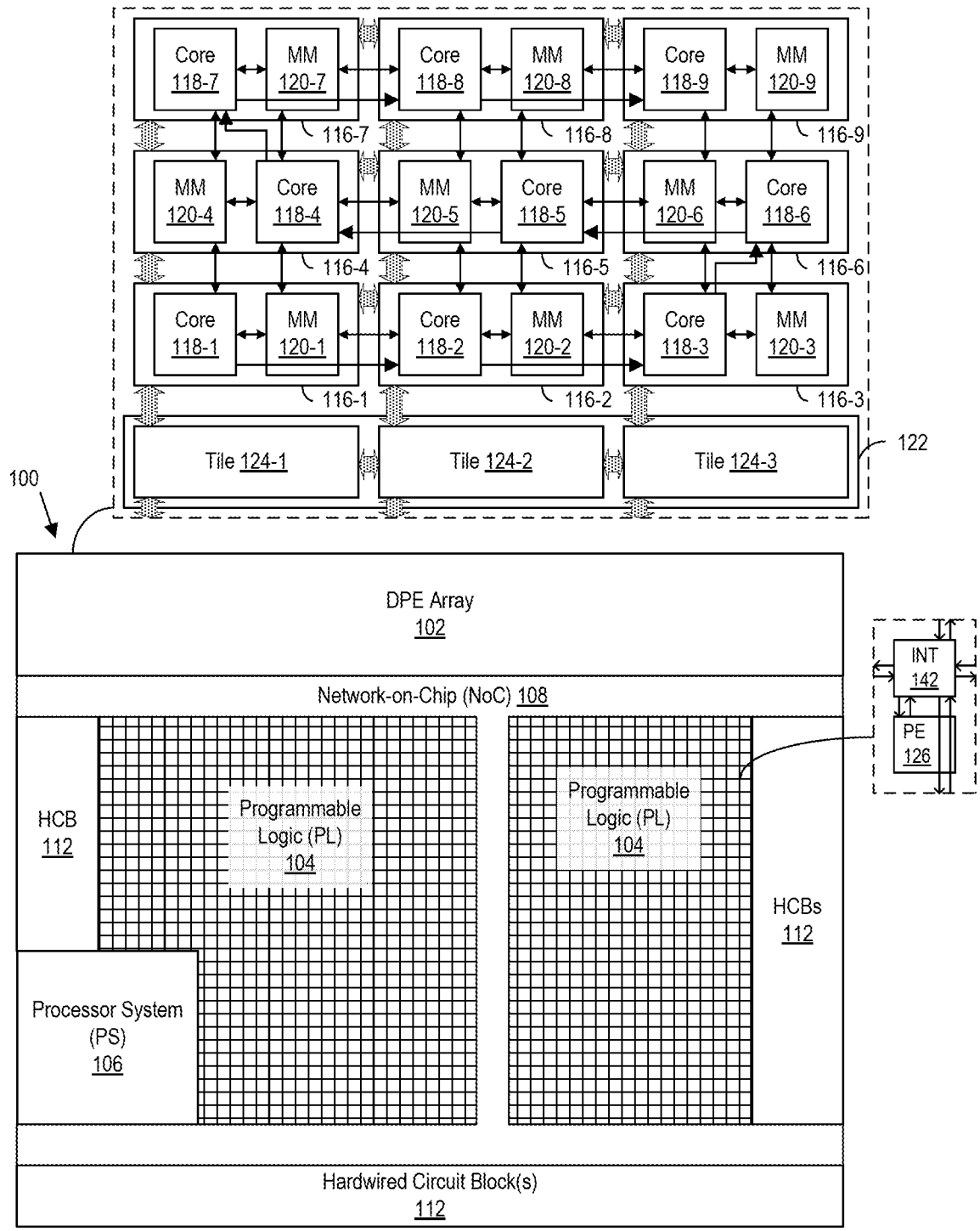
FIG. 1 illustrates an example architecture for a heterogeneous integrated circuit (IC).

While the disclosure concludes with claims defining novel features, it is believed that the various features described within this disclosure will be better understood from a consideration of the description in conjunction with the drawings. The process(es), machine(s), manufacture(s), and any variations thereof described herein are provided for purposes of illustration. Specific structural and functional details described within this disclosure are not to be interpreted as limiting, but merely as a basis for the claims and as a representative basis for teaching one skilled in the art to variously employ the features described in virtually any appropriately detailed structure. Further, the terms and phrases used within this disclosure are not intended to be limiting, but rather to provide an understandable description of the features described.

This disclosure relates to a unified data model (UDM) for use by one or more design applications for a heterogeneous integrated circuit (IC). The traditional approach to developing circuit designs for implementation in a heterogeneous IC has been one that relies on the use of multiple different design applications. Each portion of the user's circuit design corresponding to a particular system of the heterogeneous IC is created using the particular design application suited to that system. In large part, this is due to the disparate nature of the various systems in the heterogeneous IC. That is, the underlying architectures, functions, and purposes of the different systems may be so disparate that each is modeled in the corresponding design application in a way that is specific to that system. Each of the system-specific design applications, for example, may use a different logical representation of the user's circuit design or relevant portion thereof and a different device model representing the heterogeneous IC or applicable system thereof.

As an example, consider a heterogeneous IC including a processor array system and a programmable logic system. The processor array design application may represent the portion of the user's circuit design intended for implementation in the processor array using an entirely different set of logical constructs than are used by the programmable logic design application to represent the portion of the user's circuit design intended for implementation in the programmable logic. Similarly, the two design applications may utilize different device models. For example, the processor array design application may represent the processor array and corresponding signals therein using entirely different constructs than are used to represent the programmable logic and corresponding signals.

This type of approach prevents the user from obtaining a high-level view of the circuit design and of the implementation of the circuit design across the different systems of the heterogeneous IC. This piecemeal approach also hinders cross-system optimization of the circuit design as performed by the design application(s). In consequence, the quality of the resulting circuit design, as measured using one or more or any combination of metrics may be degraded. Examples of metrics that may be degraded may include, but are not limited to, power consumption, area usage, device resource usage, and timing related metrics such as operating speed, bandwidth, and latency.

In accordance with the inventive arrangements described within this disclosure, a UDM is provided that may be used by one or more different design applications for implementing a circuit design for a heterogeneous IC. The UDM provides a uniform software framework that may be used by different system-specific design applications for the heterogeneous IC. The UDM may include a logical aspect that is capable of representing a user's circuit design using a set of common constructs across a plurality of disparate systems of a heterogeneous IC. For example, using the UDM, a unified netlist may be created that includes or represents different portions of the user's circuit design intended for implementation in the different systems of the heterogeneous IC. These different portions may be specified using a common set of netlist objects.

As defined within this disclosure, the term "unified netlist" means a single netlist that includes netlist objects capable of establishing bitwise connections, netlist objects capable of establishing network connections, and netlist objects capable of establishing both bitwise and network connections. A unified netlist will include netlist objects intended to be implemented or mapped to different systems of a heterogeneous IC and are capable of connecting to one another using bitwise and/or network connections.

The UDM also may include a physical aspect that is capable of representing the disparate systems of a heterogeneous IC using a set of common constructs. The physical aspect of the UDM provides a unified device model that includes representations of two or more or each of the systems of the heterogeneous IC. In general, the unified device model includes device model objects to which netlist objects may be mapped. As defined within this disclosure, the term "unified device model" means a device model for a heterogeneous IC. A heterogeneous IC is an IC that includes two or more different systems.

Taking the logical and physical aspects together, the UDM provides a uniform infrastructure upon which design applications may be built. By using the UDM, an Electronic Design Automation (EDA) system is capable of presenting the user with a consistent and uniform view of the entire circuit design across the different systems of the heterogeneous IC. The EDA system is also capable of illustrating implementation details of the circuit design across these different systems.

Further, by using the UDM, the EDA system is better able to analyze and/or optimize aspects of the circuit design in a manner that crosses boundaries between systems of the heterogeneous IC, thereby resulting in a higher quality implementation of the circuit design for the heterogeneous IC. The resulting implementation of the circuit design in the heterogeneous IC, for example, may be improved with respect to one or more or any combination of the metrics such as power consumption, area usage, device resource usage, operating speed, bandwidth, and/or latency than had the UDM not been used.

Further aspects of the inventive arrangements are described below in greater detail with reference to the figures. For purposes of simplicity and clarity of illustration, elements shown in the figures have not necessarily been drawn to scale. For example, the dimensions of some of the elements may be exaggerated relative to other elements for clarity. Further, where considered appropriate, reference numbers are repeated among the figures to indicate corresponding, analogous, or like features.

FIG. 1 illustrates an example architecture for a heterogeneous IC 100. IC 100 is also an example of a programmable IC, an adaptive system, and a System-on-Chip (SoC). In the example of FIG. 1, IC 100 is implemented on a single die provided within a single package. In other examples, IC 100 may be implemented using a plurality of interconnected dies within a single package where the various resources of IC 100 (e.g., circuits) illustrated in FIG. 1 are implemented across the different interconnected dies.

In the example, IC 100 includes a plurality of different systems including a data processing engine (DPE) array 102, programmable logic (PL) 104, a processor system (PS) 106, a Network-on-Chip (NoC) 108, and one or more hardwired circuit blocks 112.

DPE array 102 is an example of a processor array. DPE array 102 is implemented as a plurality of interconnected and programmable data processing engines (DPEs) 116. DPEs 116 may be arranged in an array and are hardwired. Each DPE 116 can include one or more cores 118 and a memory module (abbreviated "MM" in FIG. 1) 120. In one example implementation, cores 118 of DPEs 116 may be implemented as custom circuits that do not execute program code. In another example implementation, cores 118 of DPEs 116 are capable of executing program code stored in core-specific program memories (not shown) contained within each respective core 118. As an example, a core 118 of a DPE 116 may be implemented as a vector processor capable of performing both fixed and floating-point operations and/or a scalar processor. Each memory module 120 may serve as a data memory. Each core 118 is capable of directly accessing (e.g., reading and/or writing) the memory module 120 within the same DPE 116 and the memory module 120 of any other DPE 116 that is adjacent to the core 118 of that DPE 116 in the up, down, left, and right directions.

DPE array 102 includes dedicated multi-bit data movement channels connecting the DPEs 116. For example, DPEs 116 are interconnected by programmable DPE interconnect circuitry. The programmable DPE interconnect circuitry may include one or more different and independent networks. For example, the programmable DPE interconnect circuitry may include a streaming network formed of interconnected stream switches supporting streaming connections. The streaming switches and streaming connections are represented in FIG. 1 by shaded arrows. The programmable DPE interconnect circuitry may include other types of networks and/or connections not illustrated in FIG. 1. Each DPE 116 further can include support for direct memory access (DMA) operations and locks to move data to and from other DPEs 116. Cores 118 may be directly connected with adjacent cores 118 via core-to-core cascade connections.

It should be appreciated that the number of DPEs 116 illustrated in FIG. 1 is for purposes of illustration. DPE array 102 may include more DPEs 116 than shown where DPE array 102 includes more rows of DPEs 116 and/or more columns of DPEs 116. For example, in some cases, DPE array 102 may include hundreds of DPEs 116. In other examples, DPE array 102 may include fewer DPEs 116 than shown in FIG. 1.

DPE array 102 includes an interface circuit block 122 that connects DPEs 116 to other resources of IC 100. In the example of FIG. 1, interface circuit block 122 includes a plurality of interconnected tiles 124 organized in a row. In one example, each of tiles 124 may have a same architecture. In another example, tiles 124 may be implemented with different architectures where each different tile architecture supports communication with different types of resources of IC 100. Tiles 124 are connected so that data may be propagated from one tile 124 to another bi-directionally. Each tile 124 is capable of operating as an interface for the column of DPEs 116 directly above. For example, tiles 124 may include stream switches that connect to the stream switches in DPEs 116. As noted, within DPE array 102, DPEs 116 communicate with one another via network connections facilitated by the interconnected stream switches. Similarly, tiles 124 are capable of communicating with one another and with DPEs 116 via network connections facilitated by the interconnected stream switches.

As defined within this disclosure, the term "network connection" refers to a communication link formed of a plurality of bitwise connections where the network connection exchanges packet-based or stream data. As defined within this disclosure, the term "bitwise connection" refers to a single wire that carries a signal (e.g., a one-bit signal). For example, a network connection may be formed of 32, 64, 128, or more bitwise connections. Each network connection is considered one connection as opposed to "n" bitwise connections considered to be "n" different and independent connections or signals, where "n" is an integer value of 1 or more.

For example, the portion of a circuit design implemented in DPE array 102 may have connectivity defined in terms of network connections. That is, from a user point of view using the design applications, the connectivity among DPEs 116 and/or tiles 124 is defined on a network connection basis rather than specifying connectivity for individual bitwise connections between DPEs 116 and/or tiles 124. Each network connection may be treated as a single unit or entity.

PL 104 is circuitry that may be programmed to perform specified functions. As an example, PL 104 may be implemented as field programmable gate array type of circuitry. PL 104 can include an array of programmable circuit blocks. As defined herein, the term "programmable logic" means circuitry used to build reconfigurable digital circuits. Programmable logic is formed of many programmable circuit blocks that provide basic functionality. The topology of PL 104 is highly configurable unlike hardwired circuitry. Each programmable circuit block of PL 104 typically includes a programmable element 126 (e.g., a functional element) and a programmable interconnect 142.

The programmable interconnects 142 provide the highly configurable topology of PL 104. The programmable interconnects 142 may be configured on a per wire basis where each wire conveys a single bit of information to provide connectivity among the programmable elements 126 of programmable circuit blocks of PL 104. As such, circuitry implemented in PL 104 communicates via bitwise connections facilitated by programmable interconnects 142 unlike connectivity among DPEs 116, for example, or other circuit blocks that communicate via network connections.

Examples of programmable circuit blocks of PL 104 include configurable logic blocks having look-up tables and registers. Unlike hardwired circuitry described below and sometimes referred to as hardwired circuit blocks, these programmable circuit blocks have an undefined function at the time of manufacture.

PL 104 may include other types of programmable circuit blocks that also provide basic and defined functionality with more limited programmability. Examples of these circuit blocks may include digital signal processing blocks (DSPs), phase lock loops (PLLs), and block random access memories (BRAMs). These types of programmable circuit blocks, like others in PL 104, are numerous and intermingled with the other programmable circuit blocks of PL 104. These circuit blocks may also have an architecture that generally includes a programmable interconnect 142 that uses bitwise connections and a programmable element 126. As such, circuit blocks such as DSPs, PLLs, and BRAMs are considered part of the highly configurable topology of PL 104.

Prior to use, PL 104, e.g., the programmable interconnects 142 and the programmable elements 126, must be programmed or "configured" by loading data referred to as a configuration bitstream into internal configuration memory cells therein. The configuration memory cells, once loaded with a configuration bitstream, for example, define how PL 104 is configured in terms of topology and how PL 104 operates in terms of the particular functions performed. Within this disclosure, a "configuration bitstream" is not equivalent to program code executable by a processor or computer.

PS 106 is implemented as hardwired circuitry that is fabricated as part of IC 100. PS 106 may be implemented as, or include, any of a variety of different processor types each capable of executing program code. For example, PS 106 may be implemented as an individual processor or a plurality of processors. Each processor may include one or more processor cores. PS 106 also may include one or more modules, co-processors, I/O interfaces, and/or other resources. PS 106 may be implemented using any of a variety of different types of architectures. Example architectures that may be used to implement PS 106 may include, but are not limited to, an ARM processor architecture, an x86 processor architecture, a graphics processing unit (GPU) architecture, a mobile processor architecture, a DSP architecture, combinations of the foregoing architectures, or other suitable architecture that is capable of executing computer-readable instructions or program code.

NoC 108 is a programmable interconnecting network for sharing data between endpoint circuits in IC 100. The endpoint circuits can be disposed in DPE array 102, PL 104, PS 106, and/or selected hardwired circuit blocks 112. NoC 108 can include high-speed data paths with dedicated switching. NoC 108 also supports network connections. In an example, NoC 108 includes one or more horizontal paths, one or more vertical paths, or both horizontal and vertical path(s). The arrangement and number of regions shown in FIG. 1 is merely an example. NoC 108 is an example of the common infrastructure that is available within IC 100 to connect selected components and/or subsystems.

In general, connections that are to be routed through NoC 108 are unknown until a design is created for implementation within IC 100. NoC 108 may be programmed by loading configuration data into internal configuration registers that define how elements within NoC 108 such as switches and interfaces are configured and operate to pass data from switch to switch and among the NoC interfaces to route connections thereby connecting the endpoint circuits. NoC 108 is fabricated as part of IC 100 (e.g., is hardwired) and, while not physically modifiable, may be programmed to establish network connectivity between different master circuits and different slave circuits of a user circuit design.

Hardwired circuit blocks 112 are special-purpose circuit blocks fabricated as part of IC 100. Though hardwired, hardwired circuit blocks 112 may be configured by loading configuration data into control registers to implement one or more different modes of operation. Examples of hardwired circuit blocks 112 may include input/output (I/O) blocks, transceivers for sending and receiving signals to circuits and/or systems external to IC 100, memory controllers, or the like. Examples of different I/O blocks may include single-ended and pseudo differential I/Os. Examples of transceivers may include high-speed differentially clocked transceivers. Other examples of hardwired circuit blocks 112 include, but are not limited to, cryptographic engines, digital-to-analog converters (DACs), analog-to-digital converters (ADCs), and the like. In general, hardwired circuit blocks 112 are application-specific circuit blocks.

IC 100 is an example where a first design application may be used to implement those portions of a user circuit design intended for DPE array 102, a second design application to implement those portions of the user circuit design intended for PL 104, and a third design application to implement those portions of the user circuit design for NoC 108. A further design application may be used to implement those portions of the user circuit design for PL 104. As noted, circuitry in PL 104, for example communicates using bitwise connections. By comparison, DPE array 102, PS 106, hardwired circuit blocks 112, and NoC 108 communicate using network connections where each network connection typically represents many bitwise connections that are configurable as a single entity, for example, a 32, 64, or 128-bit network connection.

Within this disclosure, examples of different systems of a heterogeneous IC are described. These different systems are provided and described for purposes of illustration. It should be appreciated that the inventive arrangements described within this disclosure may be used to create user circuit designs for other types of heterogenous ICs having systems and/or circuit blocks the same as and/or different from those described herein. For example, other heterogeneous ICs may include different combinations of circuit blocks and/or systems that use bitwise connections, network connections, or different combinations thereof where the example implementations described herein still may be used and/or applied. As such, the inventive arrangements may be used for creating circuit designs for heterogeneous ICs having systems the same as or different from those described herein.

Figure 2:
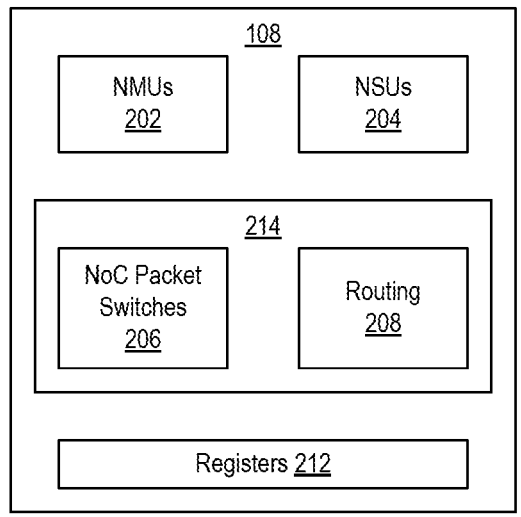
FIG. 2 illustrates an example implementation of a Network-on-Chip of the heterogeneous IC of FIG. 1.

FIG. 2 illustrates an example implementation of NoC 108. NoC 108 includes NoC master units (NMUs) 202, NoC slave units (NSUs) 204, a network 214, and registers 212. NMUs 202 and NSUs 204 are capable of connecting to endpoint circuits. Endpoint circuits coupled to NMUs 202 and NSUs 204 can be hardwired circuit blocks 112, circuits implemented in PL 104, components in PS 106, and/or DPEs 116 in DPE array 102. A given endpoint circuit can be coupled to more than one NMU 202 or more than one NSU 204.

NMUs 202 are capable of originating transactions, e.g., reads and writes, on NoC 108 while NSUs 204 respond to the transactions originated by NMUs 202. NMUs 202 are connected to NSUs 204 through network 214. In an example, network 214 includes NoC packet switches (NPSs) 206 and routing 208 between NPSs 206. Each NPS 206 performs switching of NoC packets. NPSs 206 are connected to each other and to NMUs 202 and NSUs 204 through routing 208 to implement a plurality of physical channels. NPSs 206 also support multiple virtual channels per physical channel.

NMUs 202, NSUs 204, and NPSs 206 can include registers 212 that determine the functionality thereof. Registers 212 in NoC 108 support interrupts, Quality of Service (QoS), error handling and reporting, transaction control, power management, and address mapping control. Registers 212 can be initialized in a usable state before being reprogrammed. Subsequent to initialization, registers 212 may be reprogrammed by writing to registers 212 using write requests. Configuration data for NoC 108 can be loaded into IC 100 for programming NoC 108 and/or other endpoint circuits.

Figure 3:
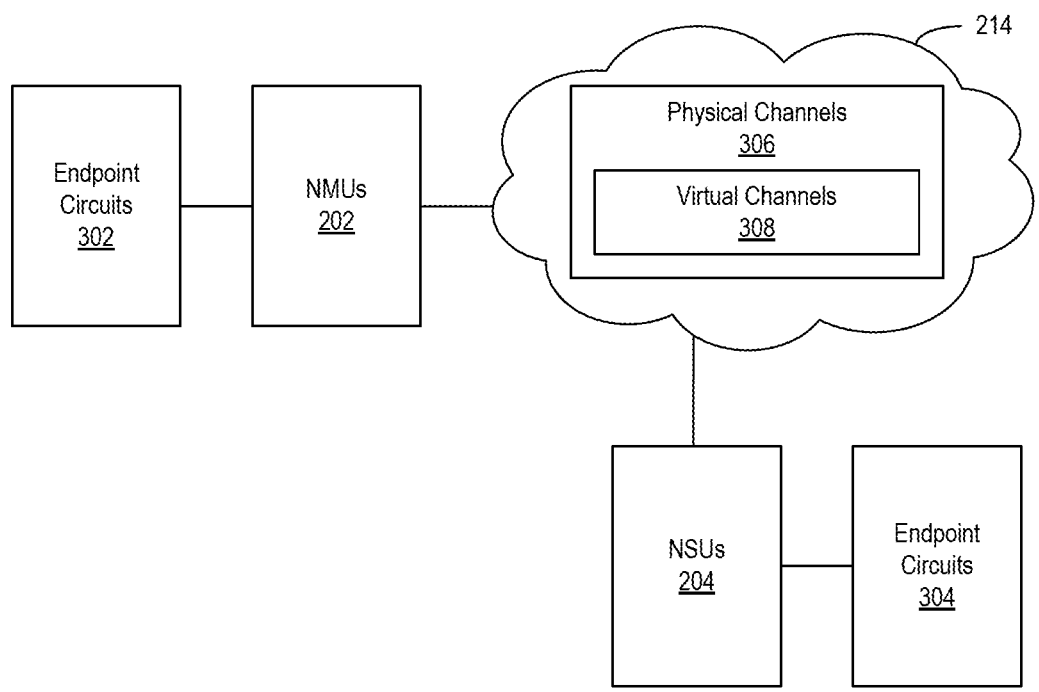
FIG. 3 illustrates example connections between endpoint circuits in the heterogeneous IC of FIG. 1 through a NoC.

FIG. 3 is a block diagram depicting connections between endpoint circuits in IC 100 through NoC 108 according to an example. In the example, endpoint circuits 302 are connected to endpoint circuits 304 through NoC 108. Endpoint circuits 302 are master circuits, which are coupled to NMUs 202 of NoC 108. Endpoint circuits 304 are slave circuits coupled to NSUs 204 of NoC 108. Each endpoint circuit 302 and 304 can be a circuit in the PS 106, a DPE 116 in DPE array 102, a circuit in a region of PL 104, or a hardwired circuit block 112.

Network 214 includes a plurality of physical channels 306. Physical channels 306 are implemented by programming NoC 108. Each physical channel 306 includes one or more NPSs 206 and associated routing 208. An NMU 202 connects with an NSU 204 through at least one physical channel 306. A physical channel 306 can also have one or more virtual channels 308. Connections through network 214 use a master-slave arrangement. In an example, the most basic connection over network 214 includes a single master connected to a single slave. However, in other examples, more complex structures can be implemented.

Figure 4:
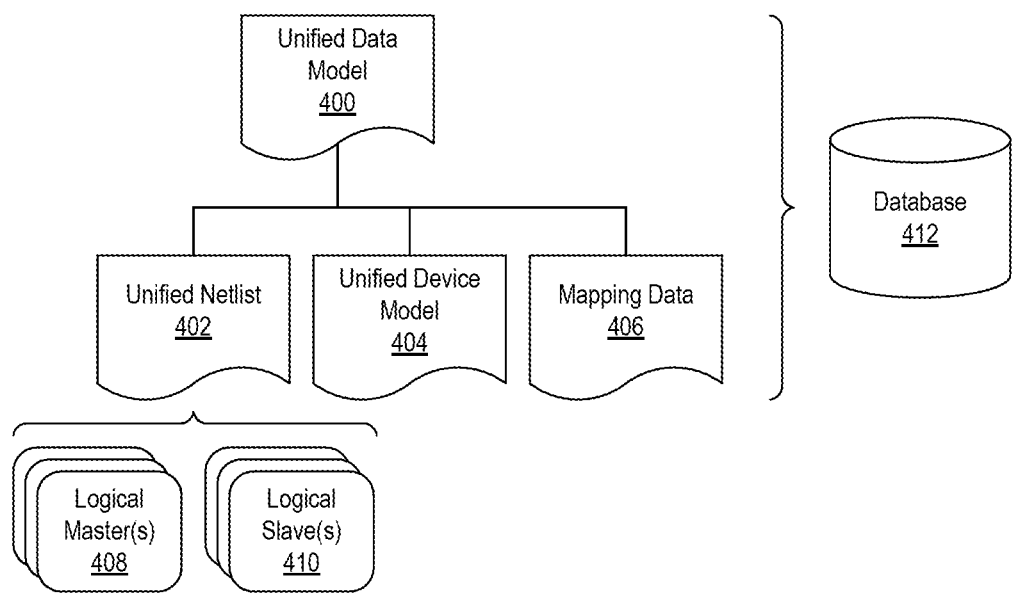
FIG. 4 illustrates an example of a unified data model (UDM).

FIG. 4 illustrates an example of a UDM 400. UDM 400 may be stored as a data structure within a computer readable storage device (not shown). One or more design applications executed by an EDA system are capable of accessing UDM 400 in a uniform manner. Such is the case despite the different applications being targeted or tailored for implementing portions of a user circuit design intended for different systems of the heterogeneous IC. As such, the different design applications, each tailored for a different system of a heterogeneous IC, may use a common set of constructs or common software infrastructure.

In the example of FIG. 4, UDM 400 is stored as a data structure in one or more computer-readable storage media. In the example, UDM 400 is stored in a database 412. UDM 400 includes a logical component referred to as a unified netlist 402 and a physical component referred to as a unified device model 404. UDM 400 further may include mapping data 406.

Unified netlist 402 is capable of specifying a user circuit design for a heterogeneous IC. The netlist objects of unified netlist 402 may include netlist objects corresponding to the different systems available in the target heterogeneous IC such as logical master(s) 408 and logical slave(s) 410. Within this disclosure, the term "target heterogeneous IC" or "target IC" refers to the particular model or part number of an IC in which a circuit design is to be implemented. Unified netlist 402 includes one or more netlist objects that, taken collectively, are capable of representing a user circuit design across different systems (e.g., DPE array 102, PL 104, PS 106, NoC 108, and/or hardwired circuit blocks 112) of IC 100. The netlist objects are capable of specifying connectivity across and among these different systems.

In an aspect, unified netlist 402 includes netlist objects that are capable of communicating by way of a variety of different types of connections. For example, some netlist objects support bitwise connections, some netlist objects support network connections, and other netlist objects support both bitwise connections and network connections. For example, netlist objects capable of supporting bitwise connections are capable of establishing bitwise connections with other netlist objects capable of supporting bitwise connections. Some netlist objects capable of supporting network connections are capable of establishing network connections with other netlist objects capable of supporting network connections. Still other netlist objects may support both bitwise connections and network connections to facilitate boundary crossing between a bitwise connection domain such as PL 104 and a packet-based connection domain such as DPE array 102, PS 106, NoC 108, and/or hardwired circuit blocks 112.

Unified device model 404 is a programmatic representation of a heterogeneous IC such as IC 100 of FIG. 1. Unified device model 404 includes a programmatic representation of the various circuits of the different systems across the heterogeneous IC. In general, unified device model 404 collapses network connections that implement packet-based communications as scalar links. Each network connection, which is formed of a plurality of individual wires or bitwise connections, is represented as a single scalar link. As such, the network connections may be represented in unified device model 404 alongside of bitwise connections that are typical of circuits implemented in PL 104. By representing network connections as scalar connections, design applications are able to generate a combined view of IC 100 where netlist objects of DPE array 102, PL 104, PS 106, NoC 108, and/or hardwired circuit blocks 112 can be analyzed together.

Mapping data 406 specifies a mapping of netlist objects of unified netlist 402 to device objects of unified device model 404 for a given circuit design. Mapping data 406 may also include placement information and routing information for unified netlist 402 relative to unified device model 404.

UDM 400 allows a user circuit design to be represented in a consistent way across systems of the heterogeneous IC. For example, database 412 is capable of storing routing information that is capable of representing overlapping placement of netlist objects where two netlist objects are assigned to a same physical component or a same component of unified device model 404 in certain situations. In a further example, database 412 is capable of storing routing information that is capable of representing many-to-one assignments of resources where, for example, different types of signals and/or nets may be assigned to a same physical resources such as wires or a plurality of wires in certain situations not generally permitted in design applications that support only programmable logic.

In one aspect, unified device model 404 may be generated by an EDA system at runtime from a more detailed device model of the heterogeneous IC. An example of an EDA system is described in connection with FIG. 12. For example, at runtime, the EDA system is capable of processing the more detailed device model by collapsing the individual wires of network components that communicate packet-based data to entities described herein as network connections. For example, the EDA system is capable of creating unified device model 404 during a model generation operation so that the design application(s) executed by the EDA system operate on a consistent and unified data structure (e.g., UDM 400) that may be used across different systems of heterogeneous IC 100 (e.g., DPE array 102, PL 104, PS 106, NoC 108, and/or hardwired circuit blocks 112).

The foregoing is an example of one technique for generating unified device model 404. In another example, unified device model 404 may be pre-generated offline.

UDM 400 is capable of bringing together the different systems of a heterogeneous IC such as IC 100 of FIG. 1 where both bitwise connections and networking connections exist within the same circuit design. As noted, UDM 400 may be used to provide design applications with the capability of analyzing heterogeneous hardware elements of IC 100 in a consistent and intuitive way. Further, the design applications are able to optimize user circuit designs across different systems of IC 100. UDM 400 also allows design applications to operate on the combined user circuit design, e.g., unified netlist 402, in a consistent environment with a unified set of design constraints.

Figure 5:
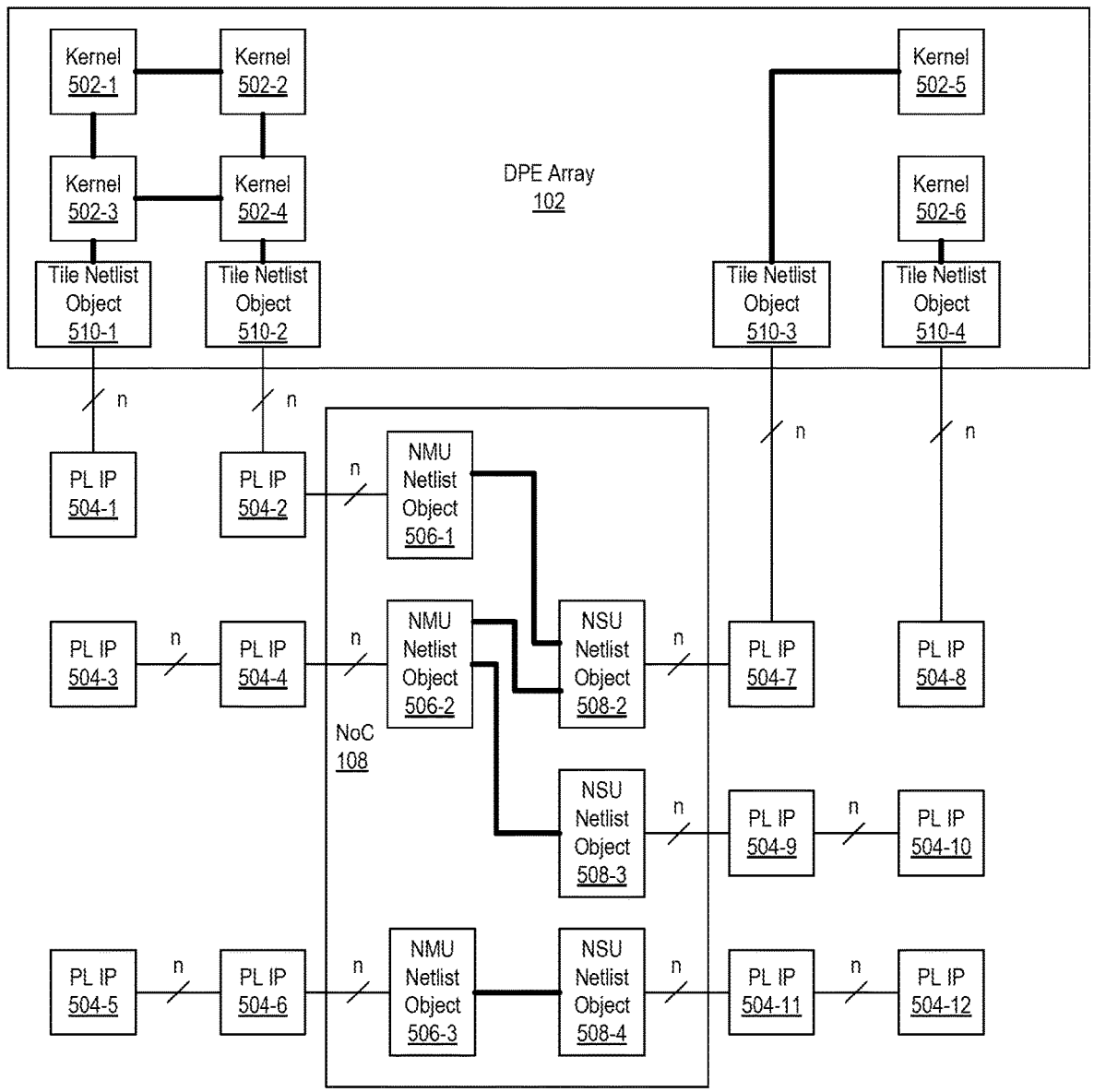
FIG. 5 illustrates an example of a unified netlist.

FIG. 5 illustrates an example of a unified netlist 500. In the example of FIG. 5, unified netlist 500 has been synthesized and placed. FIG. 5 illustrates different levels of hierarchy in unified netlist 500 such as the hierarchy shown in connection with DPE array 102 and the hierarchy shown in connection with NoC 108. FIG. 5 also illustrates an example visualization of unified netlist 500 as may be presented via a graphical user interface (GUI) of an EDA system.

In the example of FIG. 5, unified netlist 500 includes a plurality of different netlist objects. In general, the netlist objects map to corresponding device model objects. Device model objects represent actual circuit structures in IC 100. In the example of FIG. 5, unified netlist 500 includes netlist objects such as kernels 502, tile netlist objects 510, PL IPs 504, NMU netlist objects 506, and NSU netlist objects 508.

As defined herein, the term "Intellectual Property" or "IP" means a pre-designed and reusable unit of logic, cell, or chip layout design in the field of electronic circuit design. An IP is expressed as a data structure specifying a description of hardware that performs a particular function. An IP may be expressed using hardware description language file(s), as a netlist, as a bitstream that programs a programmable IC, or the like. An IP may be used as a building block within circuit designs adapted for implementation within an application-specific integrated circuit (ASIC), an SoC, a programmable IC such as, for example, an FPGA, and/or other types of ICs including heterogeneous ICs. A "PL IP" refers to an IP that is a netlist object intended to be implemented in PL 104.

NMU netlist objects 506 are netlist objects that correspond, or map, to NMU device objects. NMU device objects represent NMUs 202. NMU netlist objects 506 are examples of "master circuit netlist objects." A master circuit netlist object is a netlist object that is capable of acting as a master in a circuit design. NSU netlist objects 508 are netlist objects that correspond, or map, to NSU device objects. NSU device objects represent NSUs 204. NSU netlist objects 508 are examples of "slave circuit netlist objects." A slave circuit netlist object is a netlist object that is capable of acting as a slave in a circuit design. Tile netlist objects 510 are netlist objects that correspond, or map, to tile device objects. Tile device objects represent tiles 124 of interface circuit block 122 of DPE array 102. A "kernel," in reference to a kernel 502, is a netlist object that may be implemented as program code intended to execute on a core 118 of a DPE 116. Kernels may be mapped to core device objects of unified device model 404, where a core device object represent a core 118 of a DPE 116.

In the example of FIG. 5, netlist objects of PL 104 capable of operating as a master connect to NMU netlist objects 506 via bitwise connections. For example, PL IP 504-2 connects, as a master, to NMU netlist object 506-1 via bitwise connections. In the example of FIG. 5, bitwise connections are denoted with thinner lines having an "n" indicating the number of bits or number of bitwise connections represented. PL IP 504-4 connects, as a master, to NMU netlist object 506-2 via bitwise connections. PL IP 504-6 connects, as a master, to NMU netlist object 506-3 via bitwise connections. NMU netlist objects 506 are capable of connecting to one or more NSU netlist objects 508 via network connections. netlist objects of PL 104 capable of operating as slaves connect to NSU netlist objects 508 via bitwise connections. Bitwise connections also link tile netlist objects 510 to PL IPs 504 and connect PL IPs 504 to one another.

In the example of FIG. 5, heavier or bolded lines that connect kernels 502 together, NMU netlist objects 506 to NSU netlist objects 508, and kernels 502 to tile netlist objects 510 represent network connections between the various netlist objects shown. The network connections are carried over the circuitry described in connection with FIGS. 1, 2, and 3. Each network connection represents a plurality of bitwise connections that behave as a single entity or network connection. As noted, each network connection may be represented by UDM 400 as a scalar.

In the example of FIG. 5, each NMU netlist object 506 and each NSU netlist object 508 supports both bitwise connections and one or more network connections. For example, NMU netlist object 506-1 is connected to PL IP 504-2 via bitwise connections and to NSU netlist object 508-2 via a network connection. NMU netlist object 506-2 is connected to PL IP 504-4 via bitwise connections, to NSU netlist object 508-2 via a network connection, and to NSU netlist object 508-3 via another network connection. NMU 506-3 is connected to PL IP 504-6 via bitwise connections and to NSU netlist object 508-4 via a network connection.

NSU netlist object 508-2 is connected to NMU netlist object 506-1 via a network connection, to NMU netlist object 506-2 via a network connection, and to PL IP 504-7 via bitwise connections. NSU netlist object 508-3 is connected to NMU netlist object 506-2 via a network connection and to PL IP 504-9 via bitwise connections. NSU netlist object 508-4 is connected to NMU netlist object 506-3 via a network connection and to PL IP 504-11 via bitwise connections.

Tile netlist objects 510, like NMU netlist objects 506 and/or NSU netlist objects 508 are capable of supporting bitwise connections and one or more network connections. For example, tile netlist objects 510 are capable of establishing bitwise connections with PL IPs 504 and network connections with kernels 502 and/or other tile netlist objects 510.

In unified device model 404, bitwise connections for PL components are combined with simplified models for components of DPE array 102, PS 106, NoC 108, and/or hardwired circuit blocks 112 that communicate via network connections. In unified device model 404, physical connections and relationships between PL components, PS components, NoC components, DPE array components, and/or hardwired circuit blocks may be represented and traced using a consistent set of data structures. Within this disclosure, PS components, NoC components, DPE array components, and hardwired circuit blocks also may be referred to as "network components." The underlying software classes are the same among the PL 104 and simplified networking components of DPE array 102, PS 106, NoC 108, and/or hardwired circuit blocks 112 to provide a consistent model on which software tools may operate.

Figure 6:
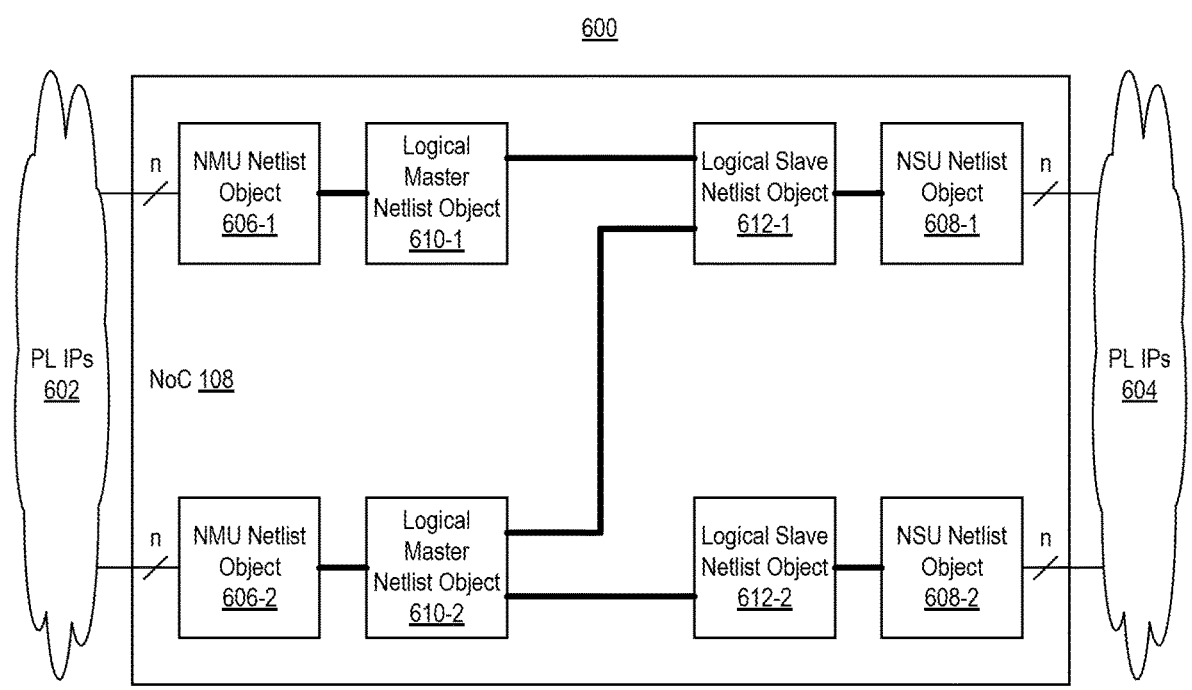
FIG. 6 illustrates another example of a unified netlist.

FIG. 6 illustrates another example of a unified netlist 600. FIG. 6 also illustrates an example visualization of unified netlist 600, or a portion thereof, as may be presented via a GUI of an EDA system. In the example of FIG. 6, unified netlist 600 has been synthesized and placed. The portion of unified netlist 600 shown corresponds to netlist objects and signal paths, e.g., bitwise connections and network connections, that traverse between PL IPs 602, NoC 108, and PL IPs 604. As part of the NoC hierarchy, unified netlist 600 includes NMU netlist objects 606 and NSU netlist objects 608.

In the example of FIG. 6, additional netlist objects referred to as logical master netlist objects 610 and logical slave netlist objects 612 are shown. FIG. 6 illustrates an example and alternative implementation where NMU netlist objects 606 and NSU netlist objects 608 are implemented as Unisim objects. A Unisim object is a primitive that cannot have a variable number of ports. The number of ports of a Unisim object, and thus the number of connections supported by the Unisim object, is predefined.

Referring to the example of FIG. 6, the NMUs and NSUs of the target IC support varying numbers of network connections. Further, the NMUs and NSUs support many-to-one mapping. In the example of FIG. 5, instances of NMU netlist objects 506 have differing numbers of connections as do different instances of NSU netlist objects 508. Such netlist objects are not Unisim objects since the number of connections supported by different instances of NMU netlist objects 506 and/or NSU netlist objects 508 differs.

In the case where netlist objects are implemented as Unisim objects having a restriction on the variability of ports from one instance of a Unisim object to another instance within a circuit design, logical master netlist objects 610 and logical slave netlist objects 612 may be introduced to support varying numbers of network connections and many-to-one mapping.

As illustrated, NMU netlist objects 606 have bitwise connections to PL IPs 602 and network connections to logical master netlist objects 610. Logical master netlist objects 610 have one or more network connections to logical slave netlist objects 612. For example, while logical master netlist object 610-1 is connected to logical slave netlist object 612-1 via a network connection, logical master netlist object 610-2 is connected to logical slave netlist object 612-1 and to logical slave netlist object 612-2 via network connections. Logical slave netlist objects 612 have one or more network connections to logical master netlist objects 610 and a network connection to NSU netlist objects 608.

While NMU netlist objects 606 and NSU netlist objects 608 correspond to device model objects (and by extension actual circuit blocks within the target heterogeneous IC), logical master netlist objects 610 and logical slave netlist objects 612 do not. That is, logical master netlist objects 610 and logical slave netlist objects 612 are netlist objects used to represent features of user circuit designs and do have corresponding device model objects or underlying circuit blocks within NoC 108. Logical master netlist objects 610 and logical slave netlist objects 612 are used to abstract signals and network connections through NoC 108 in cases where Unisim objects are used within a unified netlist.

Logical master netlist objects 610 and logical slave netlist objects 612 serve largely as pass through entities that allow overlap conditions to exist in NoC 108 when implementing many-to-one connections. For example, two signals may not share the same physical resource (e.g., wire) in PL 104. In the bitwise domain such as in PL 104, this condition is referred to as an "overlap" condition and is considered illegal. Two or more data streams or network connections can traverse through the same physical node and/or wires in NoC 108 and/or over other stream-enabled circuitry. Routing packetized data as network connections from different sources over the same physical network routing resources is permissible. These conditions must be represented and handled differently in the different domains of IC 100.

The use of logical master netlist objects 610 and logical slave netlist objects 612 facilitate the representation of one-to-many connections and many-to-one connections where packetized data traverses a common set of physical channels in cases where Unisim objects are used.

Figure 7:
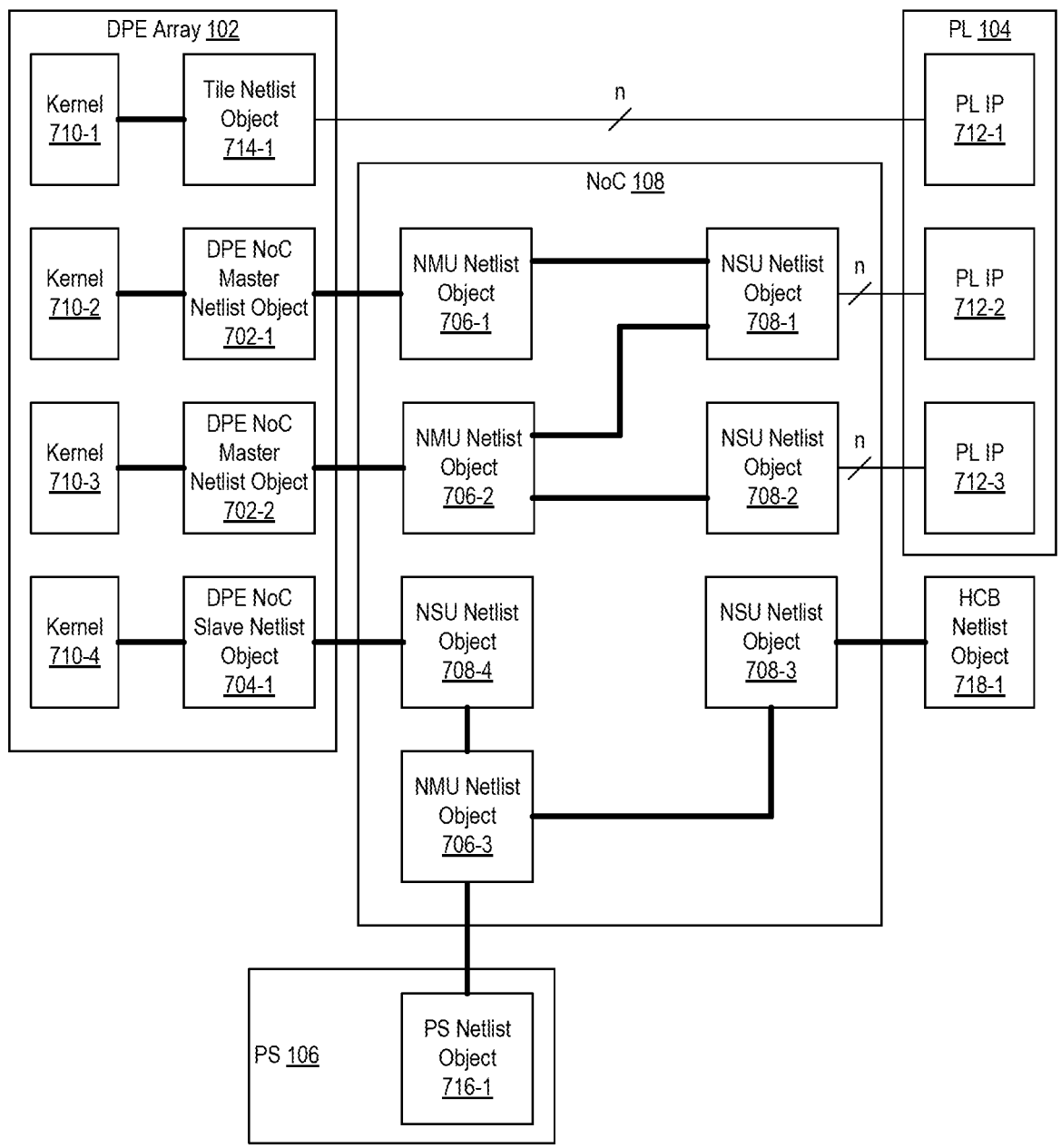
FIG. 7 illustrates another example of a unified netlist.

FIG. 7 illustrates an example of a unified netlist 700. FIG. 7 also illustrates an example visualization of unified netlist 700, or a portion thereof, as may be presented via a GUI of an EDA system. In the example of FIG. 7, unified netlist 700 has been synthesized and placed.

Unified netlist 700 illustrates a user circuit design having netlist objects corresponding to DPE array 102, PL 104, PS 106, NoC 108, and hardwired circuit blocks 112. In the example of FIG. 7, unified netlist 700 includes additional netlist objects such as DPE NoC master netlist objects 702 and DPE NoC slave netlist objects 704. In the example, when connecting to DPE array 102, NMU netlist objects 706 couple to DPE NoC master netlist objects 702 via a network connection. Similarly, when connecting to DPE array 102, NSU netlist objects 708 couple to DPE NoC slave netlist objects 704 via a network connection. As shown, DPE NoC Master netlist objects 702 and DPE NoC slave netlist objects 704 are capable of connecting to kernels 710 via network connections.

PL IPs 712 couple to other netlist objects via bitwise connections. For example, PL IP 712-1 couples to DPE array 102 via bitwise connections to tile netlist object 714-1. Tile netlist object 714-1 couples to kernel 710-1 via a network connection. Other PL IPs such as PL IP 712-2 and PL IP 712-3 couple to NoC 108 via NSU netlist object 708-1 and NSU netlist object 708-2, respectively through bitwise connections.

Unified netlist 700 further includes a PS netlist object 716-1 of PS 106. PS netlist object 716-1 may correspond to a peripheral device of PS 106 or a user application mapped to a particular processor and/or core of PS 106. PS netlist object 716-1 is capable of connecting to NoC 108 via a network connection with NMU netlist object 706-3. For example, PS netlist object 716-1 may be a master netlist circuit object. In the example of FIG. 7, NMU netlist object 706-3 is coupled to NSU netlist object 708-4 and to NSU netlist object 708-3. Thus, PS netlist object 716-1 is capable of communicating, as a master, with kernel 710-4 and hardwired circuit block (HCB) netlist object 718-1. HCB netlist object 718-1, for example, may be a memory controller.

Figure 8:
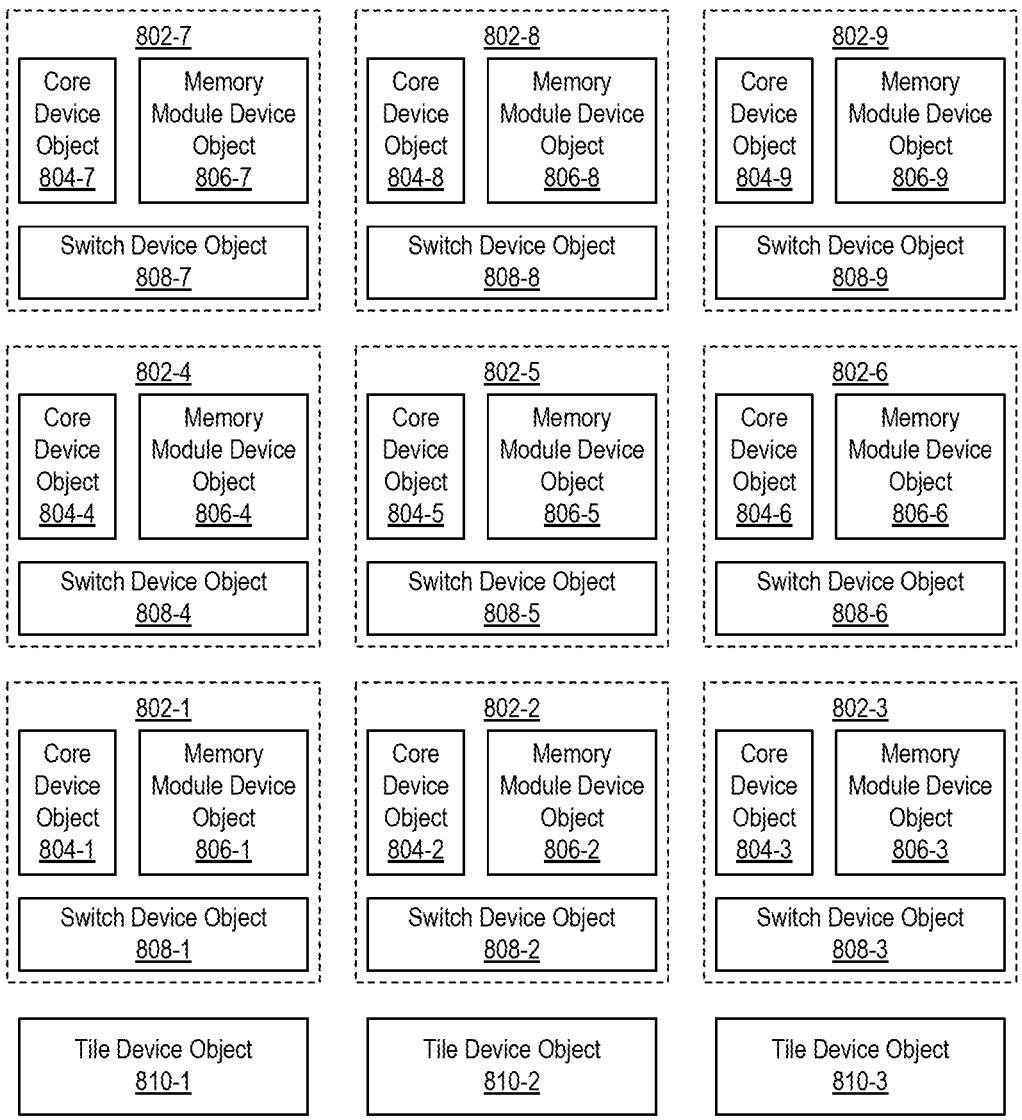
FIG. 8 illustrates a graphic illustration of an example unified device model corresponding to a processor array.

FIG. 8 illustrates a graphic illustration of an example unified device model 800 corresponding to DPE array 102 of FIG. 1. In the example of FIG. 8, DPE device objects 802 represent DPEs 116. The number of DPE device objects 802 illustrated in the example of FIG. 8 corresponds to the number of actual DPEs 116 in the target IC. Each of DPE device objects 802 includes a core device object 804 corresponding to a core 118, a memory module device object 806 corresponding to a memory module 120, and a switch device object 808 corresponding to a stream switch. At the bottom of each column of DPE device objects 802 is a tile device object 810 representing a tile 124 of FIG. 1.

The graphic illustration of unified device model 800 may be displayed by an EDA system. Netlist objects from unified netlist 402 may be superimposed on unified device model 800 to illustrate synthesis, placement, routing operations and/or the mapping of netlist objects to device objects. Using unified device model 800, netlist objects from the unified netlist of the user's circuit design may be graphically shown in context of the heterogeneous IC.

Figure 9:
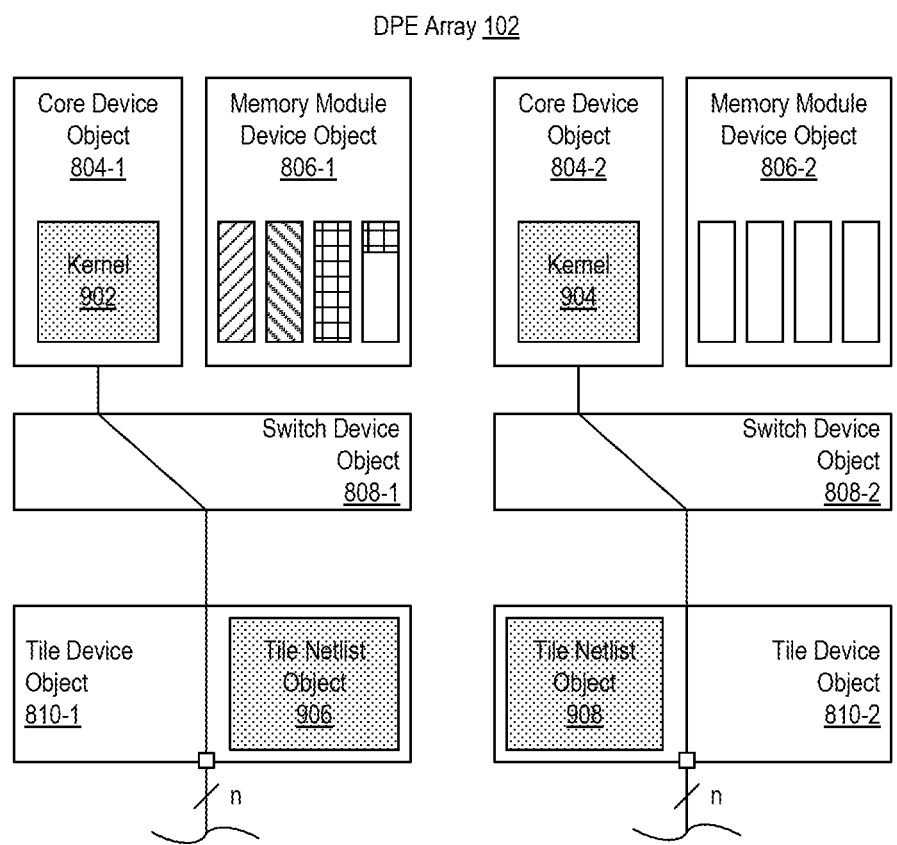
FIG. 9 illustrates an example of a graphical representation of a portion of a unified netlist corresponding to a processor array superimposed over a graphical representation of a device model for the heterogeneous IC.

FIG. 9 illustrates an example of a graphical representation of a portion of a unified netlist corresponding to DPE array 102 superimposed over a graphical representation of a unified device model for the heterogeneous IC. In the example of FIG. 9, two kernels 902 and 904 (e.g., netlist objects) are placed, or mapped, to core device objects 804-1 and 804-2, respectively. Further, the mapping of buffer netlist objects to individual memory banks of the memory module device object 806-1 is shown. In the example of FIG. 9, memory module device objects 806 are shown to include 4 memory banks. The particular buffer netlist object that is allocated to each of the various memory banks may be illustrated with different visual characteristics (e.g., color, shading, texture, etc.) to visually distinguish one buffer netlist object from another. The example of FIG. 9 illustrates that the first memory bank from left to right in memory module device object 806-1 is fully utilized to implement a first buffer netlist object. The second memory bank of memory module device object 806-1 is fully utilized to implement a second buffer netlist object. A third buffer netlist object is mapped to the third memory bank and part of the fourth memory bank of memory module device object 806-1.

As pictured, kernel 902, being mapped to core device object 804-1, is connected by a network connection to tile device object 810-1. The network connection is routed through switch device object 802-2. A tile netlist object 906 supporting network connections and bitwise connections is mapped to tile device object 810-1. Connections that exit tile device object 810-1 may be a plurality of bitwise connections that continue to PL 104. Similarly, kernel 904, being mapped to core device object 804-2, is connected by a network connection to tile device object 810-2. The network connection is routed through switch device object 808-2. A tile netlist object 908 supporting network connections and bitwise connections is mapped to tile device object 810-2. Signals that exit tile device object 810-2 may be a plurality of bitwise connections that continue to PL 104.

In one or more example implementations, the device model corresponding to interface block 122 is capable of supporting multiple data streams. In this regard, multiple netlist objects may be assigned to particular device objects. For example, one, two, or more tile netlist objects may be mapped to a single tile device object. Each tile netlist object may represent a particular data stream. Mapping two or more tile netlist objects to a single tile device object enables the tile device object to support multiple, independent data streams being allocated to the underlying tile of interface block 122. This mapping allows each of the data streams to be mapped or assigned to a particular physical channel implemented in the tile of the interface block 122. As an illustrative and nonlimiting example, a tile device object may be assigned a number of tile netlist objects that is less than or equal to the number of physical channels supported by the tile device object and the actual tile circuit block of interface block 122.

In one or more other example implementations, two or more kernels may be assigned to a same core device object. In cases, for example, where two or more kernels are intended to time share a particular core, the kernel type netlist objects that are to time share a particular core of the DPE array may be allocated to the same core device object representing the core to be shared.

Figure 10:
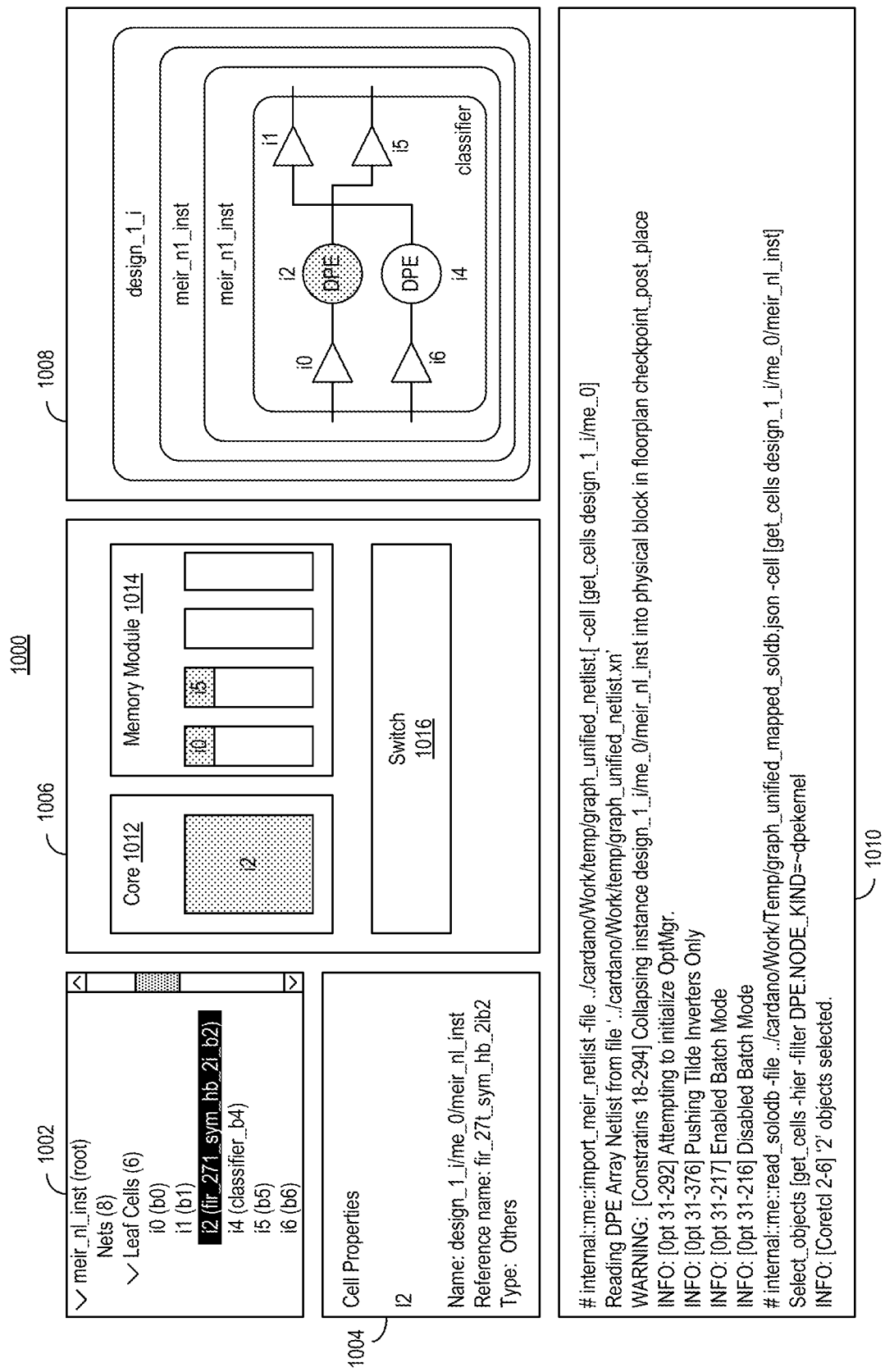
FIG. 10 is an example of a graphical user interface generated by an electronic design automation system.

FIG. 10 is an example of a GUI 1000 generated by an EDA system such as the example EDA system described in connection with FIG. 12. GUI 1000 includes a plurality of different regions 1002, 1004, 1006, 1008, and 1010.

Region 1002 displays a hierarchical view of the unified netlist. Using region 1002, a user is capable of scrolling through the unified netlist to view any portion thereof and further may expand and collapse the hierarchies of different portions thereof. In the example of FIG. 10, the netlist object "i2" is selected as illustrated with highlighting. Region 1004 displays various properties of the particular netlist object that may be highlighted or otherwise selected in region 1002, 1006, and/or 1008. For example, region 1004 presents properties for the netlist object "i2" that is selected in region 1002.

Region 1006 presents a view of the netlist objects as placed and/or routed and superimposed over a visualization of the unified device model of the heterogeneous IC. As shown in region 1006, netlist object "i2" is a kernel that is to be placed in a particular core of a DPE in the DPE array. The DPE to which netlist object "i2" is placed includes a core 1012, a memory module 1014, and a switch 1016, where each is represented by a corresponding device object in region 1006. Accordingly, region 1006 shows netlist object "i2," e.g., a kernel, having been placed at core 1012. Further, netlist objects "i0" and "i5" corresponding to the input buffer and the output buffer, respectively, of netlist object "i2" are shown. Input buffer (netlist object "i0") is placed at the first memory bank (from left to right) of memory module 1014 denoted by the shading. Output buffer (netlist object "i5") is placed at the second memory bank (from left to right) of memory module 1014 denoted by the shading. FIG. 10 illustrates that netlist objects "i0" and "i5" do not consume the entirety of each of the memory banks. Though not illustrated in region 1006, region 1006 is capable of displaying network connections for network components together with bitwise connections concurrently.

In one or more example implementations, in cases where logical master and logical slave netlist objects are utilized, region 1006 may also illustrate the relative placement of such netlist objects superimposed over portions of the unified device model.

Region 1008 displays a schematic view of the unified netlist. The schematic view presented in region 1008 is capable of displaying network connections for network components together with bitwise connections. In the example of FIG. 10, region 1008 displays a schematic view of the unified netlist where netlist objects "i0," "i1," "i2," "i4," "i5," and "i6" are shown. Since netlist object "i2" is selected, netlist object "i2" is visually distinguished from the other netlist objects shown in the schematic view of region 1008.

In one or more example implementations, in cases where logical master and logical slave netlist objects are used, such netlist objects may be illustrated in region 1008 as part of the schematic view of the unified netlist.

Region 1010 is capable of providing a console view through which the user may enter commands via a command line type of user interface. For example, the commands that may be entered may be interactive commands that allow a user to access netlist objects, device model objects, and any associated data for such objects. Via region 1010, using UDM 400, a user may provide commands that are capable of operating on netlist objects to be implemented using DPE array 102, PL 104, PS 106, NoC 108, and/or hardwired circuit blocks 112 in a consistent way.

In one aspect, the user may enter Tcl commands to control operation of the EDA system. For example, through region 1010, the user may enter a command specifying a constraint to be added or applied to one or more netlist objects of the unified netlist and/or a command to query and/or retrieve particular netlist objects of the unified netlist. The commands may operate on any netlist objects from any of the different systems that match or conform to the command. For example, the commands may apply constraints to netlist objects across systems of the target heterogeneous IC that match particular criteria. In another example, the commands may query and/or retrieve particular netlist objects across the different systems of the target heterogeneous IC that match particular criteria. As such, a user may manipulate any of the netlist objects of the unified netlist via the single region 1010 irrespective of the particular system of the heterogeneous IC to which the netlist objects correspond.

In an example, the "get_cells" command may be used to return netlist objects corresponding to the DPE array, PL, PS, NoC, and/or hardwired circuit blocks so long as such netlist objects match the parameters of the command. In another example, the "get_bels" command may be used to return device model objects corresponding to the DPE array, PL, PS, NoC, and/or hardwired circuit blocks so long as such device model objects match the parameters of the command.

Constraint related commands such as "assign_cells_to_pblock" may be used to operate on netlist objects corresponding to the DPE array, PL, PS, NoC, and/or hardwired circuit blocks in the unified environment. Using region 1010, for example, a physical constraint may be applied to any connections, whether bitwise connections or network connections, of netlist objects that match the criteria specified by the command. This allows physical constraints to be applied to both bitwise and network connections in a uniform manner (e.g., using a same command) and through a same user interface of the EDA system.

GUI 1000 illustrates that regions 1002-1010 may operate in a coordinated manner to support cross-probing operations. Using one of the regions, a user may select a particular netlist object for cross-probing purposes. For example, the user may select a particular netlist object in region 1002 using a pointer, in region 1006 using a pointer, in region 1008 using a pointer, and/or via command line execution of a command in region 1010. In response to the user selecting a netlist object in any of regions 1002, 1006, 1008, and/or 1010, the EDA system synchronizes operation of the other regions to display the selected netlist object(s) in the particular context of each respective region (e.g., netlist view, schematic view, properties view, device model view). Further the EDA system synchronizes region 1004 to display properties of the selected netlist object(s). GUI 1000 is capable of displaying objects of the circuit design corresponding to the DPE array, PL, PS, NoC, and/or hardwired circuit blocks in a consistent way.

Figure 11:
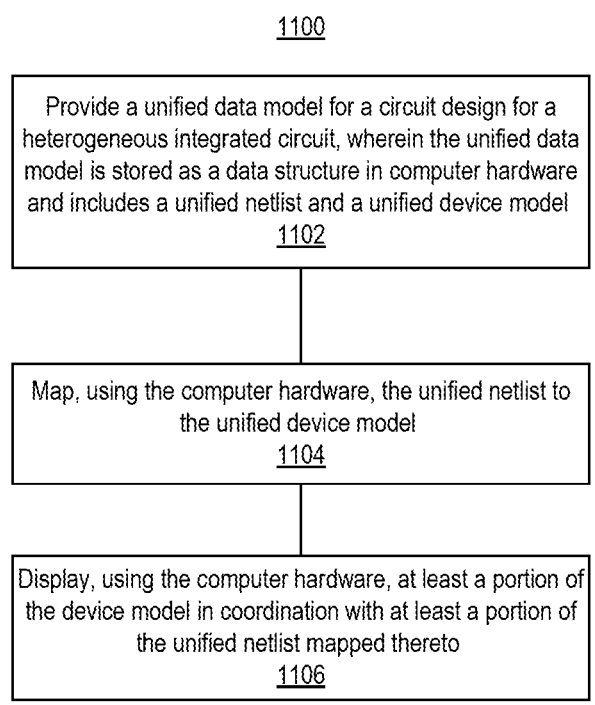
FIG. 11 is an example method of implementing a UDM for design applications for a heterogeneous IC.

FIG. 11 is an example method 1100 of implementing a UDM 400 for design applications for a heterogeneous IC. Method 1100 may be performed by an EDA system the same as or similar to the example EDA system described in connection with FIG. 12.

In block 1102, the system is capable of providing a UDM for a circuit design for a heterogeneous IC, wherein the UDM is stored as a data structure in computer hardware. The unified data model can include a unified netlist specifying the circuit design and a unified device model representing the heterogeneous IC. The unified netlist can include, e.g., comingles, netlist objects configured to communicate over bitwise connections and network connections representing packet-based communications. That is, the unified netlist includes netlist objects that are capable of communicating using bitwise connections, using network connections, or both. Each network connection represents packet-based communication.

In block 1104, the system is capable of mapping the unified netlist to the unified device model. For example, subsequent to placement and/or routing, the netlist objects may be correlated or assigned to device model objects. The mapping may be performed by synthesis where netlist objects are mapped to corresponding or allowable device model objects and by placement where netlist objects may be mapped to particular device model objects as opposed to particular types of device model objects.

In block 1106, the system is capable of displaying, using the computer hardware, at least a portion of the device model in coordination with at least a portion of the unified netlist mapped thereto. In one aspect, the portion of the unified netlist that is displayed may include one or more netlist objects capable of communicating using network connections and one or more netlist objects capable of communicating using bitwise connections, where both of such netlist objects are displayed concurrently.

The foregoing and other implementations can each optionally include one or more of the following features, alone or in combination. Some example implementations include all the following features in combination.

In one aspect, the netlist objects of the unified netlist include a first netlist object. The first netlist object can have a bitwise connection to a second netlist object corresponding to programmable logic of the heterogeneous IC and one or more network connections configured to communicate packetized data with a third netlist object.

In another aspect, the first netlist object corresponds to a Network-on-Chip of the heterogeneous IC.

In another aspect, the first netlist object corresponds to a tile circuit of a DPE array of the heterogeneous IC.

In another aspect, the netlist objects of the unified netlist include a kernel netlist object and a tile netlist object both corresponding to a DPE array of the heterogeneous IC. The kernel netlist object and the tile netlist object may be coupled by a network connection. The tile netlist object can have a bitwise network connection to a PL IP netlist object corresponding to programmable logic of the heterogeneous IC.

In another aspect, the netlist objects of the unified netlist can include a kernel netlist object and a DPE array NoC netlist object both corresponding to a DPE array of the heterogeneous IC. The kernel netlist object and the DPE array NoC netlist object can be coupled by a network connection. The DPE array NoC netlist object can have a bitwise network connection to a netlist object corresponding to a NoC of the heterogeneous IC.

In another aspect, the netlist objects of the unified netlist can include a slave circuit netlist object corresponding to a hardwired circuit block of the heterogeneous IC. The slave circuit netlist object can have a network connection to at least one other netlist object corresponding to a NoC of the heterogeneous IC.

In another aspect, the netlist objects of the unified netlist can include a master circuit netlist object corresponding to a processor system of the heterogeneous IC. The master circuit netlist object can have a network connection to at least one other netlist object corresponding to a NoC of the heterogeneous IC.

In another aspect, the method can include, responsive to a user input specifying a selected netlist object of the unified netlist, concurrently displaying a portion of the unified netlist in a first region of a user interface with the selected netlist object visually distinguished from other netlist objects in the first region and a portion of a schematic view of the unified netlist including the selected netlist object in a second region of the user interface. The selected netlist object can be visually distinguished from other netlist objects shown in the second region.

In another aspect, the concurrently displaying further includes displaying a portion of the device model to which the selected netlist object is mapped in a third region of the user interface and superimposing the selected netlist object over the portion of the device model based on a mapping of the selected netlist object to the device model.

In another aspect, the method can include applying a physical constraint to a user-selected bitwise connection and to a user-selected network connection of the unified netlist using a common command.

In another aspect, a system having a processor is capable of initiating and/or performing the various operations described within this disclosure. In still another aspect, a computer program product includes one or more computer readable storage media. Data such as the unified data model and/or program instructions are collectively stored on the one or more computer readable storage media. The program instructions are executable by computer hardware to initiate the various operations described within this disclosure.

Figure 12:
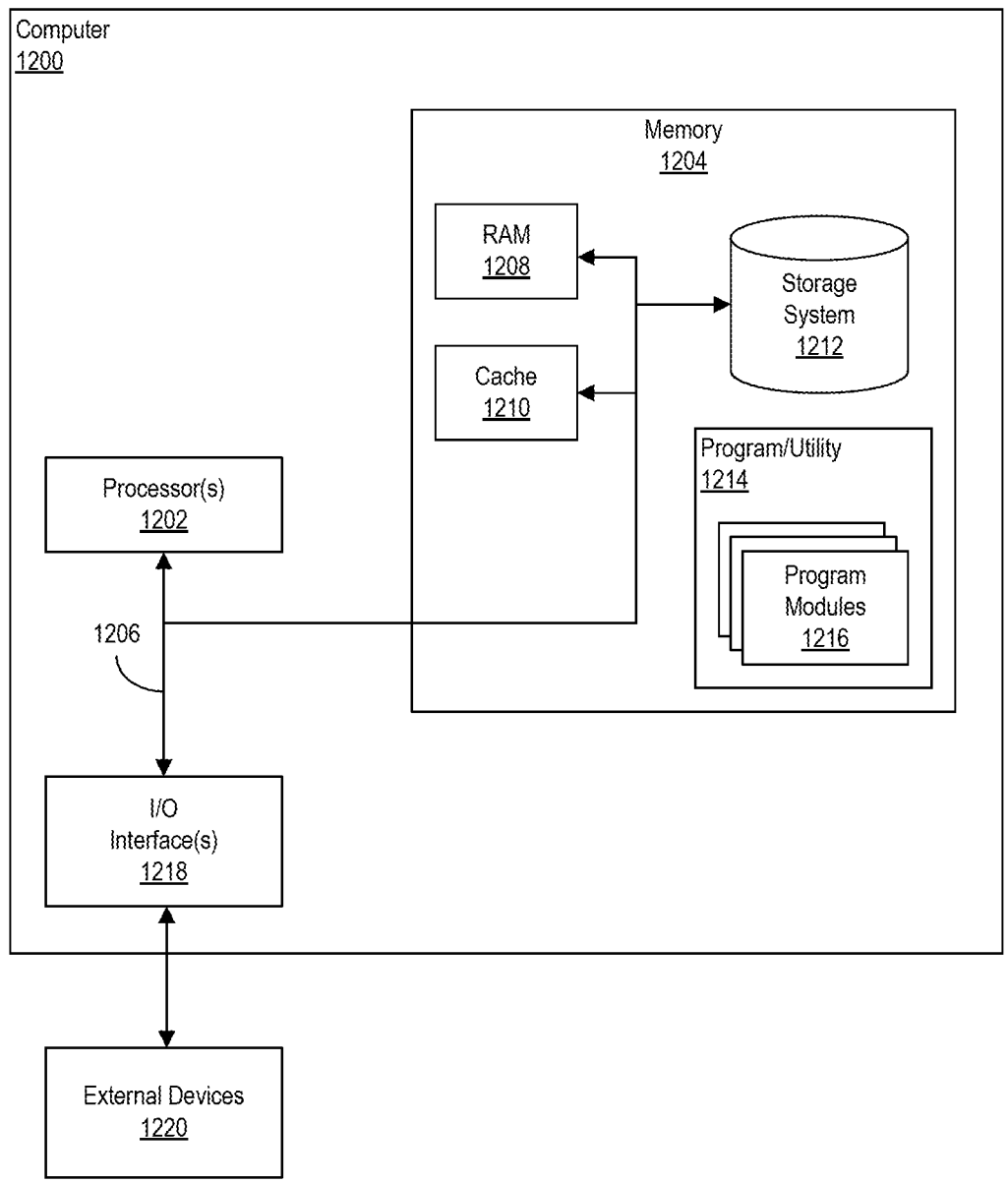
FIG. 12 illustrates an example computer for use with the inventive arrangements described within this disclosure.

FIG. 12 illustrates an example computer 1200 for use with the inventive arrangements described within this disclosure. Computer 1200 can include one or more processors 1202 (e.g., central processing units), a memory 1204, and a bus 1206 that couples various system components including memory 1204 to processor(s) 1202. Processor(s) 1202 may include any of a variety of processors that are capable of executing program code. Example processor types include, but are not limited to, processors having an x86 type of architecture (IA-32, IA-64, etc.), Power Architecture, ARM processors, and the like.

Bus 1206 represents one or more of any of several types of communication bus structures, including a memory bus or memory controller, a peripheral bus, an accelerated graphics port, and a processor or local bus using any of a variety of available bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, Peripheral Component Interconnect (PCI) bus, and PCI Express (PCIe) bus.

Computer 1200 typically includes a variety of computer readable media. Such media may be any available media that is accessible by computer 1200 and may include any combination of volatile media, non-volatile media, removable media, and/or non-removable media.

Memory 1204 may include computer readable media in the form of volatile memory, such as random-access memory (RAM) 1208 and/or cache memory 1210. Computer 1200 may also include other removable/non-removable, volatile/non-volatile computer system storage media. By way of example, storage system 1212 may be provided for reading from and writing to a non-removable, non-volatile magnetic media and/or solid-state drive (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each may be connected to bus 1206 by one or more data media interfaces. Memory 1204 may include at least one computer program product having a set (e.g., at least one) of program modules (e.g., program code) that are configured to carry out the functions and/or operations described within this disclosure.

For example, program/utility 1214, having a set (at least one) of program modules 1216 which may include, but are not limited to, an operating system, one or more application programs (e.g., user applications), other program modules, and/or program data, is stored in memory 1204. Program modules 1216 generally carry out the functions and/or methodologies as described herein at least with respect to operations performed by computer 1200.

Program/utility 1214 is executable by processor(s) 1202. Program/utility 1214 and any data items used, generated, and/or operated upon by processor(s) 1202 are functional data structures that impart functionality when employed by processor(s) 1202. As defined within this disclosure, a "data structure" is a physical implementation of a data model's organization of data within a physical memory. As such, a data structure is formed of specific electrical or magnetic structural elements in a memory. A data structure imposes physical organization on the data stored in the memory as used by an application program executed using a processor.

Computer 1200 may include one or more Input/Output (I/O) interfaces 1218 communicatively linked to bus 1206. In one aspect, I/O interface(s) 1218 may include hardware controllers that allow computer 1200 to communicate with external devices 1220 where external devices 1220 allow a user to interact with computer 1200. For example, in that case, external devices may include a keyboard, a mouse, and/or a display. In other cases, I/O interfaces 128 may include, but are not limited to, network cards, modems, network adapters, etc. that allow computer 1200 to communicate with one or more other systems.

FIG. 12 is not intended to suggest any limitation as to the scope of use or functionality of the examples described herein. Computer 1200 is an example of computer hardware (e.g., a system) that is capable of performing the various operations described within this disclosure. Computer 1200, in executing suitable operational software, is also an example of an EDA system. Computer 1200 can be practiced as a standalone device, as a bare metal server, in a cluster, or in a distributed cloud computing environment. In a distributed cloud computing environment, tasks are performed by remote processing devices that are linked through a communications network. In a distributed cloud computing environment, program modules may be located in both local and remote computer system storage media including memory storage devices.

As used herein, the term "cloud computing" refers to a computing model that facilitates convenient, on-demand network access to a shared pool of configurable computing resources such as networks, servers, storage, applications, ICs (e.g., programmable ICs) and/or services. These computing resources may be rapidly provisioned and released with minimal management effort or service provider interaction. Cloud computing promotes availability and may be characterized by on-demand self-service, broad network access, resource pooling, rapid elasticity, and measured service. Other examples of cloud computing models are described in the National Institute of Standards and Technology (NIST) and, more particularly, the Information Technology Laboratory of NIST.

Computer 1200 may be operational with numerous other general-purpose or special-purpose computing system environments or configurations. Examples of computing systems, environments, and/or configurations that may be suitable for use with computer 1200 include, but are not limited to, personal computer systems, server computer systems, thin clients, thick clients, hand-held or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

For purposes of explanation, specific nomenclature is set forth herein to provide a thorough understanding of the various inventive concepts disclosed herein. The terminology used herein, however, is for the purpose of describing particular aspects of the inventive arrangements only and is not intended to be limiting.

As defined herein, the singular forms "a," "an," and "the" are intended to include the plural forms as well, unless the context clearly indicates otherwise.

As defined herein, the terms "at least one," "one or more," and "and/or," are open-ended expressions that are both conjunctive and disjunctive in operation unless explicitly stated otherwise. For example, each of the expressions "at least one of A, B, and C," "at least one of A, B, or C," "one or more of A, B, and C," "one or more of A, B, or C," and "A, B, and/or C" means A alone, B alone, C alone, A and B together, A and C together, B and C together, or A, B and C together.

As defined herein, the term "automatically" means without human intervention. As defined herein, the term "user" means a human being.

As defined herein, the term "computer readable storage medium" means a storage medium that contains or stores program code for use by or in connection with an instruction execution system, apparatus, or device. As defined herein, a "computer readable storage medium" is not a transitory, propagating signal per se. A computer readable storage medium may be, but is not limited to, an electronic storage device, a magnetic storage device, an optical storage device, an electromagnetic storage device, a semiconductor storage device, or any suitable combination of the foregoing. The various forms of memory, as described herein, are examples of computer readable storage media. A non-exhaustive list of more specific examples of a computer readable storage medium may include: a portable computer diskette, a hard disk, a RAM, a read-only memory (ROM), an erasable programmable read-only memory (EPROM or Flash memory), an electronically erasable programmable read-only memory (EEPROM), a static random access memory (SRAM), a portable compact disc read-only memory (CD-ROM), a digital versatile disk (DVD), a memory stick, a floppy disk, or the like.

As defined herein, the term "if" means "when" or "upon" or "in response to" or "responsive to," depending upon the context. Thus, the phrase "if it is determined" or "if [a stated condition or event] is detected" may be construed to mean "upon determining" or "in response to determining" or "upon detecting [the stated condition or event]" or "in response to detecting [the stated condition or event]" or "responsive to detecting [the stated condition or event]" depending on the context.

As defined herein, the term "responsive to" and similar language as described above, e.g., "if," "when," or "upon," means responding or reacting readily to an action or event. The response or reaction is performed automatically. Thus, if a second action is performed "responsive to" a first action, there is a causal relationship between an occurrence of the first action and an occurrence of the second action. The term "responsive to" indicates the causal relationship.

As defined herein, the term "processor" means at least one circuit capable of carrying out instructions contained in program code. The circuit may be an integrated circuit or embedded in an integrated circuit.

As defined herein, the term "substantially" means that the recited characteristic, parameter, or value need not be achieved exactly, but that deviations or variations, including for example, tolerances, measurement error, measurement accuracy limitations, and other factors known to those of skill in the art, may occur in amounts that do not preclude the effect the characteristic was intended to provide.

The terms first, second, etc. may be used herein to describe various elements. These elements should not be limited by these terms, as these terms are only used to distinguish one element from another unless stated otherwise or the context clearly indicates otherwise.

A computer program product may include a computer readable storage medium (or media) having computer readable program instructions thereon for causing a processor to carry out aspects of the inventive arrangements described herein. Within this disclosure, the term "program code" is used interchangeably with the term "computer readable program instructions." Computer readable program instructions described herein may be downloaded to respective computing/processing devices from a computer readable storage medium or to an external computer or external storage device via a network, for example, the Internet, a LAN, a WAN and/or a wireless network. The network may include copper transmission cables, optical transmission fibers, wireless transmission, routers, firewalls, switches, gateway computers and/or edge devices including edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations for the inventive arrangements described herein may be assembler instructions, instruction-set-architecture (ISA) instructions, machine instructions, machine dependent instructions, microcode, firmware instructions, or either source code or object code written in any combination of one or more programming languages, including an object oriented programming language and/or procedural programming languages. Computer readable program instructions may include state-setting data. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a LAN or a WAN, or the connection may be made to an external computer (for example, through the Internet using an Internet Service Provider). In some cases, electronic circuitry including, for example, programmable logic circuitry, an FPGA, or a PLA may execute the computer readable program instructions by utilizing state information of the computer readable program instructions to personalize the electronic circuitry, in order to perform aspects of the inventive arrangements described herein.

Certain aspects of the inventive arrangements are described herein with reference to flowchart illustrations and/or block diagrams of methods, apparatus (systems), and computer program products. It will be understood that each block of the flowchart illustrations and/or block diagrams, and combinations of blocks in the flowchart illustrations and/or block diagrams, may be implemented by computer readable program instructions, e.g., program code.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the operations specified in the flowchart and/or block diagram block or blocks.

The computer readable program instructions may also be loaded onto a computer, other programmable data processing apparatus, or other device to cause a series of operations to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various aspects of the inventive arrangements. In this regard, each block in the flowchart or block diagrams may represent a module, segment, or portion of instructions, which comprises one or more executable instructions for implementing the specified operations.

In some alternative implementations, the operations noted in the blocks may occur out of the order noted in the figures. For example, two blocks shown in succession may be executed substantially concurrently, or the blocks may sometimes be executed in the reverse order, depending upon the functionality involved. In other examples, blocks may be performed generally in increasing numeric order while in still other examples, one or more blocks may be performed in varying order with the results being stored and utilized in subsequent or other blocks that do not immediately follow. It will also be noted that each block of the block diagrams and/or flowchart illustration, and combinations of blocks in the block diagrams and/or flowchart illustration, may be implemented by special purpose hardware-based systems that perform the specified functions or acts or carry out combinations of special purpose hardware and computer instructions.

The corresponding structures, materials, acts, and equivalents of all means or step plus function elements that may be found in the claims below are intended to include any structure, material, or act for performing the function in combination with other claimed elements as specifically claimed.

The description of the inventive arrangements provided herein is for purposes of illustration and is not intended to be exhaustive or limited to the form and examples disclosed. The terminology used herein was chosen to explain the principles of the inventive arrangements, the practical application or technical improvement over technologies found in the marketplace, and/or to enable others of ordinary skill in the art to understand the inventive arrangements disclosed herein. Modifications and variations may be apparent to those of ordinary skill in the art without departing from the scope and spirit of the described inventive arrangements. Accordingly, reference should be made to the following claims, rather than to the foregoing disclosure, as indicating the scope of such features and implementations.

What is claimed is:

1. A method, comprising:
   providing a unified data model for creating a circuit design for a heterogeneous integrated circuit, wherein the unified data model is stored as a data structure in computer hardware and implements a software infrastructure commonly accessible by a plurality of design applications;
   wherein the unified data model includes a unified netlist specifying the circuit design and a unified device model representing the heterogeneous integrated circuit;
   wherein the unified netlist includes one or more netlist objects configured to communicate using bitwise connections, one or more netlist objects configured to communicate using network connections, and one or more netlist objects configured to communicate using both bitwise connections and network connections, wherein the network connections represent packet-based communications and overlap conditions are permitted for one or more of the network connections;
   mapping, using the computer hardware, the netlist objects of the unified netlist to a plurality of device model objects of the unified device model, wherein the plurality of device model objects belong to a plurality of subsystems of the heterogeneous integrated circuit; and
   displaying, using the computer hardware executing one or more of the plurality of design applications, at least a portion of the device model in coordination with at least a portion of the unified netlist mapped thereto.

2. The method of claim 1, wherein the netlist objects of the unified netlist include a first netlist object, wherein the first netlist object has a bitwise connection to a second netlist object corresponding to programmable logic of the heterogeneous integrated circuit and one or more network connections configured to communicate packetized data with a third netlist object.

3. The method of claim 2, wherein the first netlist object corresponds to a Network-on-Chip of the heterogeneous integrated circuit.

4. The method of claim 2, wherein the first netlist object corresponds to a tile circuit of a data processing engine array of the heterogeneous integrated circuit.

5. The method of claim 1, wherein the netlist objects of the unified netlist include a kernel netlist object and a tile netlist object both corresponding to a data processing engine array of the heterogeneous integrated circuit, wherein the kernel netlist object and the tile netlist object are coupled by a network connection, and wherein the tile netlist object has a bitwise network connection to a Programmable Logic Intellectual Property netlist object corresponding to programmable logic of the heterogeneous integrated circuit.

6. The method of claim 1, wherein the netlist objects of the unified netlist include a kernel netlist object and a data processing engine array Network-on-Chip netlist object both corresponding to a data processing engine array of the heterogeneous integrated circuit, wherein the kernel netlist object and the data processing engine array Network-on-Chip netlist object are coupled by a network connection, and wherein the data processing engine array Network-on-Chip netlist object has a bitwise network connection to a netlist object corresponding to a Network-on-Chip of the heterogeneous integrated circuit.

7. The method of claim 1, wherein the netlist objects of the unified netlist include a slave circuit netlist object corresponding to a hardwired circuit block of the heterogeneous integrated circuit, and wherein the slave circuit netlist object has a network connection to at least one other netlist object corresponding to a Network-on-Chip of the heterogeneous integrated circuit.

8. The method of claim 1, wherein the netlist objects of the unified netlist include a master circuit netlist object corresponding to a processor system of the heterogeneous integrated circuit, and wherein the master circuit netlist object has a network connection to at least one other netlist object corresponding to a Network-on-Chip of the heterogeneous integrated circuit.

9. The method of claim 1, further comprising:
responsive to a user input specifying a selected netlist object of the unified netlist, concurrently displaying a portion of the unified netlist in a first region of a user interface with the selected netlist object visually distinguished from other netlist objects in the first region and a portion of a schematic view of the unified netlist including the selected netlist object in a second region of the user interface, wherein the selected netlist object is visually distinguished from other netlist objects shown in the second region.

10. The method of claim 9, wherein the concurrently displaying further comprises displaying a portion of the device model to which the selected netlist object is mapped in a third region of the user interface and superimposing the selected netlist object over the portion of the device model based on a mapping of the selected netlist object to the device model.

11. The method of claim 1, further comprising:
applying a physical constraint to a user-selected bitwise connection and to a user-selected network connection of the unified netlist using a common command.

12. A system, comprising:
a memory configured to store a unified data model for a circuit design for a heterogeneous integrated circuit therein as a data structure;
wherein the unified data model implements a software infrastructure commonly accessible by a plurality of design applications, the unified data model including a unified netlist specifying the circuit design and a unified device model representing the heterogeneous integrated circuit;
wherein the unified netlist includes one or more netlist objects configured to communicate using bitwise connections, one or more netlist objects configured to communicate using network connections, and one or more netlist objects configured to communicate using both bitwise connections and network connections, wherein the network connections represent packet-based communications and overlap conditions are permitted for one or more of the network connections; and
a processor configured to initiate executable operations including:
mapping the netlist objects of the unified netlist to a plurality of device model objects of the unified device model, wherein the plurality of device model objects belong to a plurality of subsystems of the heterogeneous integrated circuit; and
displaying at least a portion of the device model, using one or more of the plurality of design applications, in coordination with at least a portion of the unified netlist mapped thereto.

13. The system of claim 12, wherein the netlist objects of the unified netlist include a first netlist object, wherein the first netlist object has a bitwise connection to a second netlist object corresponding to programmable logic of the heterogeneous integrated circuit and one or more network connections configured to communicate packetized data with a third netlist object.

14. The system of claim 13, wherein the first netlist object corresponds to a Network-on-Chip of the heterogeneous integrated circuit or a tile circuit of a data processing engine array of the heterogeneous integrated circuit.

15. The system of claim 12, wherein the netlist objects of the unified netlist include a kernel netlist object and a tile netlist object both corresponding to a data processing engine array of the heterogeneous integrated circuit, wherein the kernel netlist object and the tile netlist object are coupled by a network connection, and wherein the tile netlist object has a bitwise network connection to a Programmable Logic Intellectual Property netlist object corresponding to programmable logic of the heterogeneous integrated circuit.

16. The system of claim 12, wherein the netlist objects of the unified netlist include a kernel netlist object and a data processing engine array Network-on-Chip netlist object both corresponding to a data processing engine array of the heterogeneous integrated circuit, wherein the kernel netlist object and the data processing engine array Network-on-Chip netlist object are coupled by a network connection, and wherein the data processing engine array Network-on-Chip netlist object has a bitwise network connection to a netlist object corresponding to a Network-on-Chip of the heterogeneous integrated circuit.

17. The system of claim 12, wherein the netlist objects of the unified netlist include a slave circuit netlist object corresponding to a hardwired circuit block of the heterogeneous integrated circuit, and wherein the slave circuit netlist object has a network connection to at least one other netlist object corresponding to a Network-on-Chip of the heterogeneous integrated circuit.

18. The system of claim 12, wherein the netlist objects of the unified netlist include a master circuit netlist object corresponding to a processor system of the heterogeneous integrated circuit, and wherein the master circuit netlist object has a network connection to at least one other netlist object corresponding to a Network-on-Chip of the heterogeneous integrated circuit.

19. The system of claim 12, wherein the processor is configured to initiated executable operations further comprising:
applying at least one of a timing constraint or a physical constraint to a user-selected bitwise connection and to a user-selected network connection of the unified netlist.

20. A computer program product, comprising:
one or more computer readable storage media storing a unified data model for a circuit design for a heterogeneous integrated circuit therein as a data structure;
wherein the unified data model implements a software infrastructure commonly accessible by a plurality of design applications, the unified data model including a unified netlist specifying the circuit design and a unified device model representing the heterogeneous integrated circuit;
wherein the unified netlist includes one or more netlist objects configured to communicate using bitwise connections, one or more netlist objects configured to communicate using network connections, and one or more netlist objects configured to communicate using both bitwise connections and network connections, wherein the network connections represent packet-based communications and overlap conditions are permitted for one or more of the network connections; and wherein the one or more computer readable storage media store program instructions executable by computer hardware to initiate operations including:
  mapping the netlist objects of the unified netlist to a plurality of device model objects of the unified device model, wherein the plurality of device model objects belong to a plurality of subsystems of the heterogeneous integrated circuit; and
  displaying, using one or more of the plurality of design applications, at least a portion of the device model in coordination with at least a portion of the unified netlist mapped thereto.

\* \* \* \* \*